(12) United States Patent
Kim et al.

(10) Patent No.: US 11,362,147 B2
(45) Date of Patent: Jun. 14, 2022

(54) DISPLAY DEVICE

(71) Applicant: LG Display Co., Ltd., Seoul (KR)

(72) Inventors: Ho-Jin Kim, Paju-si (KR); Jonghyeok Im, Paju-si (KR); Sukhyeun Jang, Paju-si (KR); SeungMin Baik, Paju-si (KR); JiYeon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 240 days.

(21) Appl. No.: 16/526,540

(22) Filed: Jul. 30, 2019

(65) Prior Publication Data

US 2020/0043983 A1 Feb. 6, 2020

(30) Foreign Application Priority Data

Jul. 31, 2018 (KR) .................. 10-2018-0089630
Dec. 28, 2018 (KR) .................. 10-2018-0172996

(51) Int. Cl.
*H01L 27/32* (2006.01)
*H01L 51/50* (2006.01)
*G02B 27/01* (2006.01)
*G06F 1/16* (2006.01)

(52) U.S. Cl.
CPC ........ *H01L 27/322* (2013.01); *H01L 27/3246* (2013.01); *H01L 51/5044* (2013.01); *G02B 27/0172* (2013.01); *G06F 1/163* (2013.01)

(58) Field of Classification Search
CPC ............ H01L 51/5044; H01L 27/3246; H01L 27/322
See application file for complete search history.

(56) References Cited

U.S. PATENT DOCUMENTS 10,340,428 B2 * 7/2019 Koshihara ........... H01L 51/5265
2019/0096971 A1 * 3/2019 Ukigaya ................. H01L 51/56

* cited by examiner

*Primary Examiner* — Sue A Purvis
*Assistant Examiner* — Scott Stowe
(74) *Attorney, Agent, or Firm* — Morgan, Lewis & Bockius LLP

(57) ABSTRACT

A display device includes: a substrate including: first to third subpixels, an insulating layer including a trench on the substrate between at least two among the first to third subpixels, a first electrode on the insulating layer in each of the first to third subpixels, a fence in each of the first to third subpixels, the fence surrounding an edge of the first electrode, a light-emitting layer on the first electrode, the fence, and the insulating layer, a second electrode on the light-emitting layer, and a color filter layer including: a first color filter in the first subpixel, a second color filter in the second subpixel, and a third color filter in the third subpixel, wherein the second color filter is wider than the first color filter, and wherein the second color filter partially overlaps the first subpixel.

18 Claims, 18 Drawing Sheets

DISPLAY DEVICE

CROSS-REFERENCE TO RELATED APPLICATION(S)

This application claims the benefit of and priority to Korean Patent Applications No. 10-2018-0089630, filed on Jul. 31, 2018; and No. 10-2018-0172996, filed on Dec. 28, 2018; the entirety of which is hereby incorporated by reference.

BACKGROUND

1. Technical Field

The present disclosure relates to a display device, and more particularly, to a display device that emits white light.

2. Discussion of the Related Art

A display device has a structure in which a light-emitting layer is formed between an anode electrode and a cathode electrode, and is a device for displaying an image by allowing the light-emitting layer to emit light through an electric field between the two electrodes. The light-emitting layer may include an organic material for emitting light by transiting exciton generated by combination of electrons and holes from an excited state to a ground state, or may include an inorganic material, such as quantum dot.

Recently, a head mounted display (HMD) that displays a virtual reality (VR) image has been developed, wherein a focal point at a close distance is formed in front of eyes of a user in VR. In the case of the head mounted display device, it is difficult to manufacture a mask due to a compact pixel interval of high resolution and accurately align the mask. On the other hand, in the case of an organic light-emitting display device, light emitted from each pixel affects an adjacent pixel due to a leakage current caused by a compact pixel interval, whereby a problem occurs in that a color mixture is generated. Such a problem occurs more seriously in the case of a head mounted display (HMD) including an organic light-emitting display device. Therefore, studies for a head mounted display with ultra-high resolution, which can reduce or prevent a color mixture, have been actively ongoing.

SUMMARY

Accordingly, the present disclosure is directed to a display device that substantially obviates one or more of the issues due to limitations and disadvantages of the related art.

An aspect of the present disclosure is to provide a display device that can reduce or prevent a color mixture caused by a leakage current from being generated.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a substrate including: a first subpixel, a second subpixel, and a third subpixel, an insulating layer including a trench on the substrate between at least two among the first subpixel, the second subpixel, and the third subpixel, a first electrode on the insulating layer in each of the first subpixel, the second subpixel, and the third subpixel, a fence in each of the first subpixel, the second subpixel, and the third subpixel, the fence surrounding an edge of the first electrode, a light-emitting layer on the first electrode, the fence, and the insulating layer, a second electrode on the light-emitting layer, and a color filter layer including: a first color filter in the first subpixel, a second color filter in the second subpixel, and a third color filter in the third subpixel, wherein the second color filter is wider than the first color filter, and wherein the second color filter partially overlaps the first subpixel.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
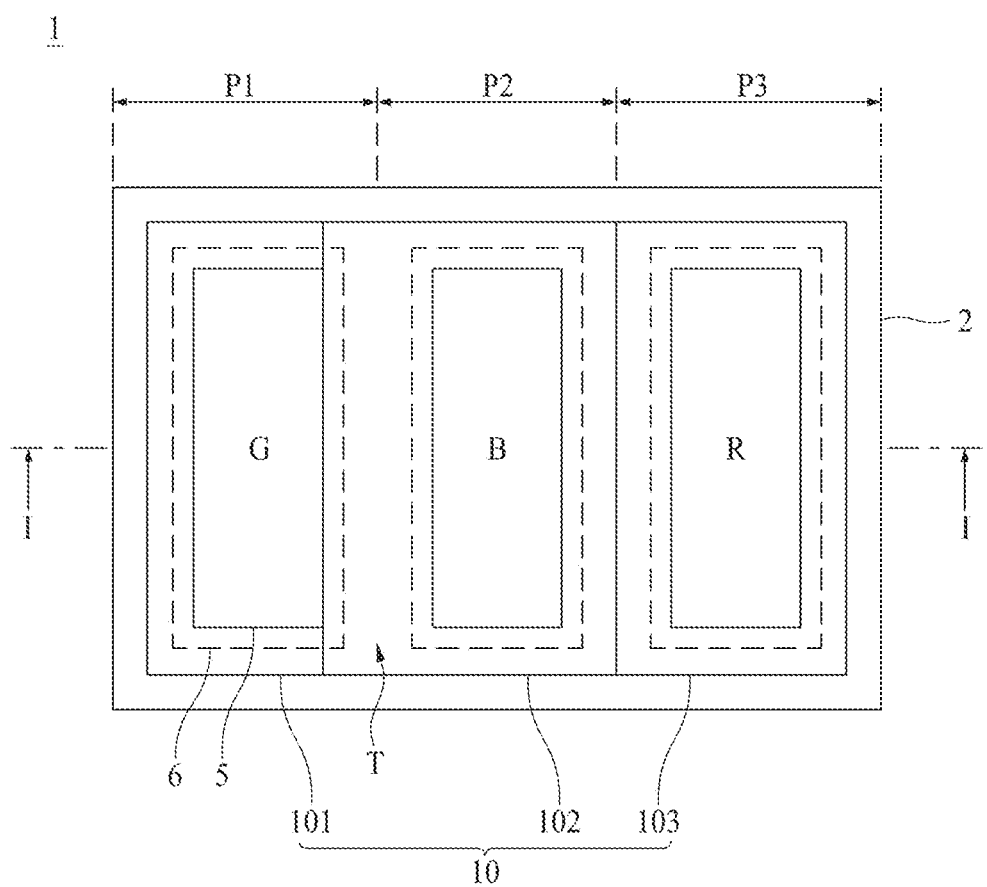
FIG. 1 is a plan view illustrating a display device according to a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. May be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a display device according to an embodiment of the present disclosure will be described in detail with reference to the accompanying drawings.

Figure 2:
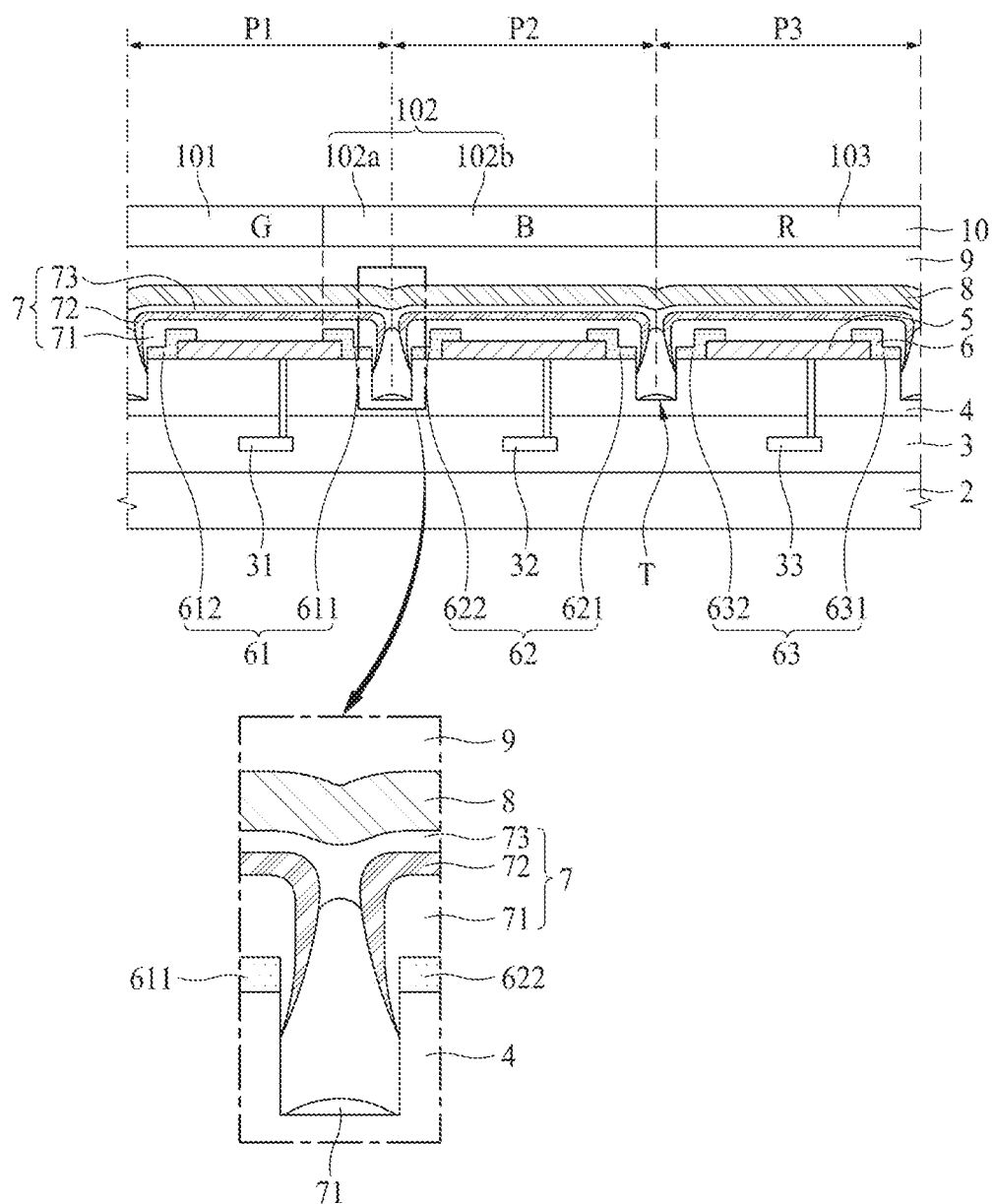
FIG. 2 is a cross-sectional view taken along line I-I shown in FIG. 1.
Figure 3:
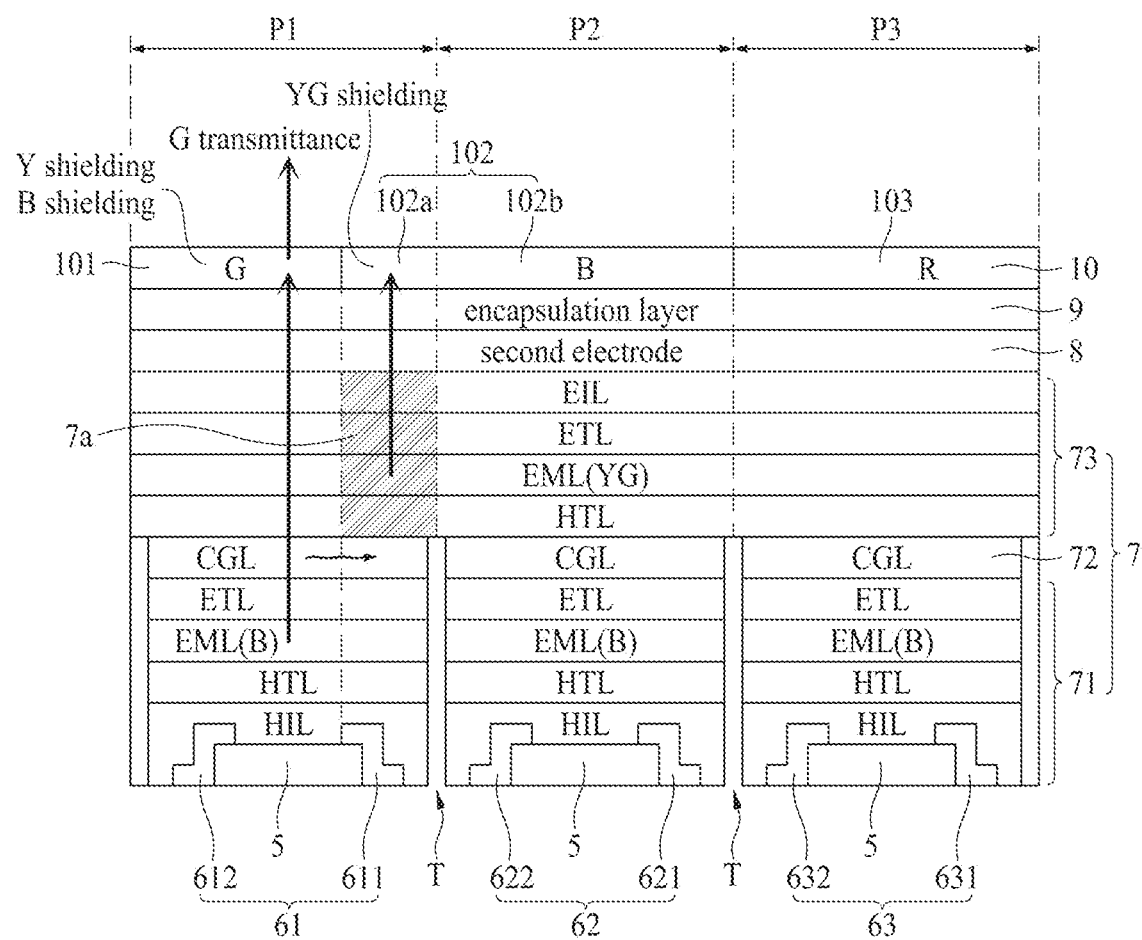
FIG. 3 is a cross-sectional view illustrating a display device according to the first embodiment of the present disclosure, which includes a light-emitting layer.

FIG. 1 is a plan view illustrating a display device according to a first embodiment of the present disclosure. FIG. 2 is a cross-sectional view taken along line I-I shown in FIG. 1. FIG. 3 is a cross-sectional view illustrating a display device according to the first embodiment of the present disclosure, which includes a light-emitting layer.

With reference to FIG. 1, the display device 1 according to the first embodiment of the present disclosure may include a substrate 2, a first electrode 5, a fence 6, a trench T, and a color filter layer 10. The color filter layer 10 may include a first color filter 101, a second color filter 102, and a third color filter 103.

A plurality of subpixels P1, P2, and P3 may be formed on the substrate 2. The plurality of subpixels P1, P2, and P3 may include a first subpixel P1, a second subpixel P2 and a third subpixel P3. As the first subpixel P1, the second subpixel P2, and the third subpixel P3 may be arranged in order, the second subpixel P2 may be arranged at one side of the first subpixel P1, for example, at a right side of the first subpixel P1, to adjoin the first subpixel P1, and the third subpixel P3 may be arranged at one side of the second subpixel P2, for example, at a right side of the second subpixel P2, to adjoin the second subpixel P2. In the present disclosure, when it is described that two subpixels are arranged to adjoin each other should be interpreted that no other subpixel may be between the two subpixels.

The first to third subpixels P1, P2, and P3 may be respectively provided as the same size. For example, the first to third subpixels P1, P2, and P3 may respectively be provided with the same width and the same height. For example, the width may refer to, but is not limited to, a horizontal direction based on FIG. 1, and the height may refer to, but is not limited to, a vertical direction based on FIG. 1.

Each of a boundary surface between the first subpixel P1 and the second subpixel P2 and a boundary surface between the second subpixel P2 and the third subpixel P3 may be arranged at a half of a width of the trench T. Therefore, the respective subpixels P1, P2, and P3 may be symmetrically arranged at both sides based on the half-width of the trench.

The first subpixel P1 may emit green (G) light, the second subpixel P2 may emit blue (B) light, and the third subpixel P3 may emit red (R) light. However, these pixels are not limited to this example. For example, the first subpixel P1 may emit red (R) light, and the third subpixel P3 may emit green (G) light. According to the first embodiment of the present disclosure, the first subpixel P1 emitting red (R) light or green (G) light, and the third subpixel P3 emitting green (G) light or red (R) light may be arranged to adjoin both sides of the second subpixel P2 emitting blue (B) light.

The first electrode 5 may be patterned for each of the subpixels P1, P2, and P3. For example, one first electrode 5 may be formed on the first subpixel P1, another first electrode 5 may be formed on the second subpixel P2, and another one first electrode 5 may be formed on the third subpixel P3. The first electrode 5 may serve as an anode of the display device of the present disclosure.

The fence 6 may surround edges of the first electrode 5. An exposed area of the first electrode 5, which may be exposed without being covered by the fence 6, may constitute a light-emitting area. Therefore, the light-emitting area may be defined by the fence 6.

The trench T may be formed among the plurality of subpixels P1, P2, and P3. The trench T may reduce or prevent a leakage current from occurring between the respective subpixels P1, P2, and P3 adjacent to each other. If the respective subpixels P1, P2, and P3 are provided at compact intervals to embody high resolution, and a light-emitting layer in any one of the subpixels P1, P2, and P3 emits light, charges in the light-emitting layer may move to a light-emitting layer in another adjacent subpixel, whereby it may be likely that a leakage current occurs. Therefore, in the first embodiment of the present disclosure, the trench T may be formed among the subpixels P1, P2, and P3 to allow the light-emitting layer formed in the trench T to be partially disconnected, whereby a leakage current may be reduced or prevented from occurring between adjacent subpixels. However, for example, even when the light-emitting layer is formed until the light-emitting layer is completely disconnected among the subpixels P1, P2, and P3, it may be likely that a leakage current may occur in the portion in which the light-emitting layer may be formed.

The color filter layer 10 may be respectively provided in the first to third subpixels P1, P2, and P3 to shield a particular color of light emitted from the light-emitting layer of each subpixel. For example, the first color filter 101 provided in the first subpixel P1 may shield light of colors other than green (G) light. For example, the first color filter 101 may be provided as a green color filter. The second color filter 102 provided in the second subpixel P2 may shield light of colors other than blue (B) light. For example, the second color filter 102 may be provided as a blue color filter. The third color filter 103 provided in the third subpixel P3 may shield light of colors other than red (R) light. For example, the third color filter 103 may be provided as a red color filter. However, without limitation to this example, the first color filter 101 may be provided as a red color filter, and the third color filter 103 may be provided as a green color filter.

The first to third color filters 101, 102, and 103, respectively provided in the first to third subpixels P1, P2, and P3, may have the same size as that of each subpixel, or may be smaller or larger than each subpixel by a certain ratio. For example, it may be difficult to exactly align each color filter in each subpixel. For example, in the case of a head mounted display device of high resolution, which may have a compact pixel interval, a problem may occur in that it may be more difficult to align a color filter. If each color filter is not exactly aligned for each subpixel and light emitted from any one subpixel affects an adjacent subpixel, a problem may occur in that a color mixture may be generated.

To solve the problem of the color mixture, the display device 1 according to the first embodiment of the present disclosure may include a color filter layer 10 of a subpixel for transmitting only light of a particular color, for example, a blue color filter, which may have a size different from that of the color filter layer 10 of another adjacent subpixel. A detailed description of the color filter layer will be described below with reference to the accompanying drawings.

With reference to FIGS. 1 to 3, the display device 1 according to the first embodiment of the present disclosure may include a substrate 2, a circuit element layer 3, an insulating layer 4, a first electrode 5, a fence 6, a light-emitting layer 7, a second electrode 8, an encapsulation layer 9, and a color filter layer 10. The color filter layer 10 may include a first color filter 101, a second color filter 102, and a third color filter 103.

The substrate 2 may include a plastic film, a glass substrate, or a semiconductor substrate, such as silicon. The substrate 2 may include a transparent material or an opaque material. The first subpixel P1, the second subpixel P2, and the third subpixel P3 may be provided on the substrate 2. The first subpixel P1 may transmit green (G) light, the second subpixel P2 may transmit blue (B) light, and the third subpixel P3 may transmit red (R) light.

The display device 1 according to the first embodiment of the present disclosure may be provided as a top-emission structure in which light may be emitted to a top portion, and therefore an opaque material, as well as a transparent material, may be used as a material of the substrate 2. The color filters 101, 102, and 103 may be provided at the top portion of each of the subpixels P1, P2, and P3 from which light may be emitted, to transmit light of the above colors.

The circuit element layer 3 may be formed on the substrate 2. A circuit element, including a plurality of thin-film transistors 31, 32, and 33, various types of signal lines, and a capacitor, may be provided on the circuit element layer 3 for each of the subpixels P1, P2, and P3. The signal lines may include gate lines, data lines, power lines and reference lines, and the thin-film transistors 31, 32, and 33 may include a switching thin-film transistor, a driving thin-film transistor, and a sensing thin-film transistor. The subpixels P1, P2, and P3 may be defined by a crossing structure of gate lines and data lines.

The switching thin-film transistor may be switched in accordance with a gate signal supplied to the gate line, and may supply a data voltage supplied from the data line to the driving thin-film transistor. The driving thin-film transistor may be switched in accordance with the data voltage supplied from the switching thin-film transistor to generate a data current from a power source supplied from the power line, and may supply the generated data current to the first electrode 5.

The sensing thin-film transistor may sense a threshold voltage deviation of the driving thin-film transistor, which may be a cause of image degradation, and may supply a current of the driving thin-film transistor to the reference line in response to a sensing control signal supplied from the gate line or a separate sensing line. The capacitor may maintain the data voltage supplied to the driving thin-film transistor for one frame, and may be connected to each of a gate terminal and a source terminal of the driving thin-film transistor.

A first thin-film transistor 31, a second thin-film transistor 32, and a third thin-film transistor 33 may be arranged in the circuit element layer 3 separately for each of the subpixels 21, 22, and 23. The first thin-film transistor 31 according to one example may be connected to the first electrode 5, arranged on the first subpixel P1, to apply a driving voltage for emitting light of a color corresponding to the first subpixel P1.

The second thin-film transistor 32 according to one example may be connected to the first electrode 5, arranged on the second subpixel P2, to apply a driving voltage for emitting light of a color corresponding to the second subpixel P2. The third thin-film transistor 33 according to one example may be connected to the first electrode 5, arranged on the third subpixel P3, to apply a driving voltage for emitting light of a color corresponding to the third subpixel P3.

Each of the first subpixel P1, the second subpixel P2, and the third subpixel P3, according to one example, may supply a certain current to a light-emitting layer in accordance with the data voltage of the data line when a gate signal from the gate line is input thereto using each of the thin-film transistors 31, 32, and 33. As such, the light-emitting layer of each of the first subpixel P1, the second subpixel P2, and the third subpixel P3 may emit light with a certain brightness in accordance with the certain current.

The insulating layer 4 may be provided on the substrate 2. For example, the insulating layer 4 may be arranged on the circuit element layer 3 on the substrate 2. The insulating layer 4 may planarize an upper surface of the substrate 2 while protecting the circuit element layer 3. The insulating layer 4 may include, but is not limited to, an organic insulating material. The insulating layer 4 may include an inorganic insulating material.

The insulating layer 4 may be provided with a trench T of a recessed structure. The trench T may be formed in, but is not limited to, only the insulating layer 4. The trench T may be extended to an inner portion of the circuit element layer 3 below the insulating layer 4. The trench T may be formed between the first subpixel P1 and the second subpixel P2, and between the second subpixel P2 and the third subpixel P3.

The first electrode 5 may be patterned for each of the subpixels P1, P2, and P3 on the insulating layer 4. The first electrode 5 may be connected with the driving thin-film transistor provided in the circuit element layer 3. For example, the first electrode 5 may be connected with a source terminal or a drain terminal of the driving thin-film transistor. For example, a contact hole for exposing the source terminal or the drain terminal of the driving thin-film transistor may be formed in the insulating layer 4 and the circuit element layer 3. The first electrode 5 may be connected with the source terminal or the drain terminal of the driving thin-film transistor through the contact hole.

The display device 1 according to the first embodiment of the present disclosure may be provided as a top-emission structure. For example, the first electrode 5 may reflect light emitted from the light-emitting layer 7 to a top portion. For example, the first electrode 5 may include a double structure of a reflective layer for reflecting light emitted from the light-emitting layer 7 to a top portion, and a transparent conductive layer for supplying a hole to the light-emitting layer 7.

The fence 6 may be formed on the insulating layer 4 to cover the edge of the first electrode 5. Therefore, as shown in the cross-sectional view of FIG. 2, the fence 6 may cover both ends of the first electrode 5 provided in each of the subpixels P1, P2, and P3. For example, the fence 6 may be formed at both ends of the first electrode 5 to cover a portion of an upper surface and a side of the first electrode 5 and a portion of the insulating layer 4. Therefore, a current may be concentrated on the ends of the first electrode 5, whereby a problem may occur in that light-emitting efficiency may be deteriorated. A partial area on the upper surface of the first electrode 5, which may be exposed without being covered by the fence 6, may become a light-emitting area. The fence 6 may be provided at both ends of the first electrode 5 to cover a portion of the upper surface and a side of the first electrode 5. The fence 6 may include, but is not limited to, an inorganic insulating film.

The fence 6 may include a first fence 61 covering both ends of the first electrode 5 of the first subpixel P1, a second fence 62 covering both ends of the first electrode 5 of the second subpixel P2, and a third fence 63 covering both ends of the first electrode 5 of the third subpixel P3. The first fence 61, the second fence 62 and the third fence 63 may respectively be provided to adjoin the trench T. As shown in FIG. 2, after the fence 6 is entirely formed among the subpixels P1, P2, and P3, the fence 6 and a particular area of the insulating layer 4 below the fence 6 may be removed between the first subpixel P1 and the second subpixel P2, and between the second subpixel P2 and the third subpixel P3 to form the trench T. Therefore, the trench T may be formed together with the fence 6 and the insulating layer 4 below the fence 6. As a result, in the display device 1 according to the first embodiment of the present disclosure, a manufacturing process time of the complete display device may be reduced as compared with a case in which the fence 6 is patterned for each of the subpixels P1, P2, and P3.

The first fence 61 may include a first portion 611 overlapping one side of the first electrode 5 of the first subpixel P1, and a second portion 612 overlapping the other side of the first electrode 5. The second fence 62 may include a first portion 621 overlapping one side of the first electrode 5 of the second subpixel P2, and a second portion 622 overlapping the other side of the first electrode 5. The third fence 63 may include a first portion 631 overlapping one side of the first electrode 5 of the third subpixel P3, and a second portion 632 overlapping the other side of the first electrode 5.

As shown in FIG. 2, the first portions 611, 621, and 631 may overlap a right portion of the first electrode 5, the second portions 612, 622, and 632 may overlap a left portion of the first electrode 5, and the first portions 611, 621, and 631 may be respectively spaced apart from the second portions 612, 622, and 632. A portion in which the first portions 611, 621, and 631 may be spaced apart from the second portions 612, 622, and 632 respectively may be the aforementioned light-emitting area.

The light-emitting layer 7 may be formed on the first electrode 5 and the insulating layer 4. The light-emitting layer 7 may be also formed on the fence 6, and may also be formed among the plurality of subpixels P1, P2, and P3.

The light-emitting layer 7 may emit white (W) light. For example, the light-emitting layer 7 may include a plurality of stacks for emitting light of different colors. For example, the light-emitting layer 7 may include a first stack 71, a second stack 73, and a charge generation layer CGL 72 provided between the first stack 71 and the second stack 73.

The light-emitting layer 7 may be formed inside and above the trench T. According to the first embodiment of the present disclosure, the light-emitting layer 7 may be formed inside the trench T, whereby a long current path may be formed between the respective subpixels P1, P2, and P3 adjacent to each other to increase resistance. Therefore, a leakage current may be reduced.

For example, with reference to the enlarged portion of FIG. 2 that is indicated by an arrow, the first stack 71 may be formed at a side inside the trench T, and may also be formed on a lower surface inside the trench T. A portion of the first stack 71 formed at the side inside the trench T and a portion of the first stack 71 formed on the lower surface inside the trench 7 may be noncontiguous, e.g., may be disconnected from each other without being connected with each other. Therefore, one side inside the trench T, for example, a portion of the first stack 71 formed at a left side, and another side inside the trench T, for example, a portion of the first stack 71 formed at a right side may be noncontiguous, e.g., may be disconnected from each other without being connected with each other. Therefore, charges cannot move between the respective subpixels P1, P2, and P3, which may be arranged to adjoin each other by interposing the trench T therebetween, through the first stack. It should be appreciated that the terms "left" and "right" are used herein for convenience of explanation, and are interchangeable, as should be understood by one of ordinary skill in the art.

Also, the charge generation layer 72 may be formed on the first stack 71 at the side inside the trench T. At this time, one side inside the trench T, for example, a portion of the charge generation layer 72 formed at a left side, and another side inside the trench T, for example, a portion of the charge generation layer 72 formed at a right side may be noncontiguous, e.g., may be disconnected from each other without being connected with each other. Therefore, charges cannot move between the respective subpixels P1, P2, and P3, which may be arranged to adjoin each other by interposing the trench T therebetween, through the charge generation layer 72. However, when a leakage current flows along the charge generation layer 72 formed to reach the trench T, light may be emitted from the second stack 73 of the light-emitting layer 7 arranged between the charge generation layer 72 and the second electrode 8.

Also, the second stack 73 may be contiguous, e.g., may be connected, with another second stack 73, without being disconnected from each other between the respective subpixels P1, P2, and P3 arranged to adjoin each other by interposing the trench T therebetween on the charge generation layer 72. Therefore, charges may move between the respective subpixels P1, P2, and P3, which may be arranged to adjoin each other by interposing the trench T therebetween, through the second stack 73. However, without limitation to this case, the second stack 73 may be noncontiguous, e.g., may be configured to be disconnected from another second stack between the respective subpixels P1, P2, and P3, which may be arranged to adjoin each other by interposing the trench T therebetween, by appropriately controlling a shape of the trench T and a deposition process of the light-emitting layer 7.

Meanwhile, the charge generation layer 72 has conductivity greater than that of each of the first stack 71 and the second stack 73. For example, when an N-type charge generation layer constituting the charge generation layer 72 includes a metal material, the N-type charge generation layer has a conductivity greater than that of each of the first stack 71 and the second stack 73. Therefore, charges may mostly move between the respective subpixels P1, P2, and P3, which may be arranged to adjoin each other, through the charge generation layer 72, and may move much less through the second stack 73. Therefore, according to the first embodiment of the present disclosure, the charge generation layer 72 may be noncontiguous, e.g., may be disconnected inside the trench T, whereby movement of charges between the respective subpixels P1, P2, and P3 arranged to adjoin each other may be reduced to avoid or prevent a leakage current from occurring.

According to the first embodiment of the present disclosure, the trench T may be formed between the first subpixel P1 and the second subpixel P2 and between the second subpixel P2 and the third subpixel P3. Therefore, when at least a portion of the light-emitting layer 7, especially the charge generation layer 72 may be noncontiguous, e.g., may be disconnected, between the first subpixel P1 and the second subpixel P2 and between the second subpixel P2 and the third subpixel P3 due to the trench T, a leakage current may be reduced or prevented from occurring between the first subpixel P1 and the second subpixel P2 and between the second subpixel P2 and the third subpixel P3.

The second electrode 8 may be formed on the light-emitting layer 7. The second electrode 8 may serve as a cathode of the display device 1 of the present disclosure. The second electrode 8 may be also formed in and between the respective subpixels P1, P2, and P3 in a similar manner as the light-emitting layer 7.

When the display device 1 according to the first embodiment of the present disclosure is provided as a top-emission structure, the second electrode 8 may include a transparent conductive material to transmit light emitted from the light-emitting layer 7 toward an upper portion. Also, the second electrode 8 may include a semi-transparent electrode. Therefore, a micro cavity effect may be obtained for each of the subpixels P1, P2, and P3. If the second electrode 8 includes a semi-transparent electrode, reflection and re-reflection of light may be repeated between the second electrode 8 and the first electrode 5 to obtain a micro cavity effect, whereby light efficiency may be improved.

The encapsulation layer 9 may be formed on the second electrode 8 to reduce or prevent external water from being permeated into the light-emitting layer 7. The encapsulation layer 9 may include, but is not limited to, an inorganic insulating material or a deposited structure of an inorganic insulating material and an organic insulating material, which may be deposited alternately.

The color filter layer 10 may be formed on the encapsulation layer 9. The color filter layer 10 may include, but is not limited to, a first color filter 101 of a green color (G) provided in the first subpixel P1, a second color filter 102 of a blue color (B) provided in the second subpixel P2, and a third color filter 103 of a red color (R) provided in the third subpixel P3. The first color filter 101 may be provided as a red (R) color filter, and the third color filter 103 may be provided as a green (G) color filter.

For convenience, portions of the first electrode 5, the first to third fences 61, 62, and 63, the light-emitting layer 7, the second electrode 8, the encapsulation layer 9, and the color filter layer 10 in three subpixels P1, P2, and P3 are shown in FIG. 3. As shown in FIG. 3, the first electrode 5, the fence 6, the light-emitting layer 7, the second electrode 8, the encapsulation layer 9, and the color filter layer 10 may be sequentially deposited.

The first electrode 5 may be patterned for each of the subpixels P1, P2, and P3. Each of the first to third fences 61, 62, and 63 may cover each end of the first electrodes 5 provided for each of the subpixels P1, P2, and P3. The light-emitting layer 7 may include a first stack 71, a second stack 73, and a charge generation layer CGL 72 provided on the first electrode 5.

The first stack 71 may be provided on the first electrode 5, and may include a hole injecting layer HIL, a hole transporting layer HTL, a blue (B) light-emitting layer EML(B), and an electron transporting layer ETL, which may be sequentially deposited. The first stack 71 may be noncontiguous, e.g., may be disconnected, between the first subpixel P1 and the second subpixel P2, and between the second subpixel P2 and the third subpixel P3, for example, in a trench (T) area.

The charge generation layer CGL 72 may supply charges to the first stack 71 and the second stack 73. The charge generation layer CGL 72 may include an N-type charge generation layer for supplying electrons to the first stack 71, and a P-type charge generation layer for supplying holes to the second stack 73. The N-type charge generation layer may include a metal material as a dopant. The charge generation layer 72 may be noncontiguous, e.g., may be disconnected, between the first subpixel P1 and the second subpixel P2, and between the second subpixel P2 and the third subpixel P3, for example, in the trench (T) area but may be connected until the trench (T) area.

The second stack 73 may be provided on the first stack 71, and may include a hole transporting layer HTL, a yellow-green (YG) light-emitting layer EML(YG), an electron transporting layer ETL, and an electron injecting layer EIL, which may be sequentially deposited. The second stack 73 may be contiguous, e.g., may be connected, between the first subpixel P1 and the second subpixel P2, and between the second subpixel P2 and the third subpixel P3.

The second electrode 8 may be formed on the light-emitting layer 7, the encapsulation layer 9 may be formed on the second electrode 8, and the color filter layer 10 may be formed on the encapsulation layer 9. The color filter layer 10 may include a first color filter 101, which may be a green (G) color filter provided in the first subpixel P1; a second color filter 102, which may be a blue (B) color filter provided in the second subpixel P2; and a third color filter 103, which may be a red (R) color filter provided in the third subpixel P3.

According to the first embodiment of the present disclosure, when the charge generation layer 72 is noncontiguous, e.g., disconnected, between the first subpixel P1 and the second subpixel P2, a leakage current may not occur between the first subpixel P1 and the second subpixel P2, but an electric field may be formed between the charge generation layer 72 and the second electrode 8, e.g., due to a leakage current, up to a portion in which the charge generation may be provided, whereby yellow-green (YG) light may be emitted from the second stack 73. However, even though the leakage current may occur between the first subpixel P1 and the second subpixel P2 due to the charge generation layer 72, a color mixture may be not generated between the subpixels P1 and P2. A reason why that the color mixture may be not generated will be described as follows.

In the display device 1, according to the first embodiment of the present disclosure, the second color filter 102 may be larger than the first color filter 101. For example, the second color filter 102 may overlap the first subpixel P1, and may therefore be provided to be larger than the first color filter 101. If the first to third subpixels P1, P2, and P3 are provided at the same size, a case in which any one color filter may overlap another subpixel may indicate that the color filter overlapping another subpixel may be larger than the color filter arranged on the overlapped subpixel. Therefore, as shown in FIG. 2, the second color filter 102 may be arranged to be extended to a portion of the first subpixel P1.

The second color filer 102 may include a first area 102a overlapping the first subpixel P1, and a second area 102b overlapping the second subpixel P2. The first portion 611 of the first fence 61 may overlap the first area 102a. For example, as shown in FIGS. 2 and 3, an end of the first portion 611, arranged on the first electrode 5, may be matched with (e.g., may coextend with) an end of the first area 102a of the second color filter 102 adjacent to the first color filter 101. Although not shown, the end of the first portion 611 may be more protruded toward the first color filter 101. For example, at least a portion of the first portion 611 may overlap the first area 102a of the second color filter 102. Therefore, the first electrode 5 covered by the first portion 611 may not contribute to formation of an electric field of the light-emitting layer 7 when the first subpixel P1 emits light, and the charge generation layer 72 may serve as the first electrode 5 due to a leakage current through the charge generation layer 72 as described above, whereby light may be emitted between the charge generation layer 72 and the second electrode 8.

For example, blue (B) light and yellow-green (YG) light may be emitted toward the first color filter 101, which may be a green color filter, by an electric field formed between the first electrode 5, which may be not covered by the first portion 611, for example, the exposed area of the first electrode 5 and the second electrode 8. The blue (B) light and the yellow (Y) light may be shielded by the first color filter 101, and only the green (G) light may be emitted. When the first electrode 5 covered by the first portion 611 cannot contribute to formation of an electric field of the light-emitting layer 7 as described above, only the yellow-green (YG) light of the second stack 73, which may be caused by the leakage current of the charge generation layer 72, may be emitted to the first area 102a. When the first area 102a is a portion of the second color filter 102, which may be a blue (B) color filter, and therefore shields the yellow-green (YG) light, no light can transmit the first area 102a. As a result, in the display device 1, according to the first embodiment of the present disclosure, it may be possible to avoid occurrence of a color mixture between the first subpixel P1 and the second subpixel P2 adjacent to the first subpixel P1 due to the leakage current of the charge generation layer 72 when the first subpixel P1 emits light.

The end of the first portion 611 cannot be arranged to be more inward than the end of the first area 102. For example, the inside (e.g., "inward") may mean a direction toward the second subpixel P2. If the end of the first portion 611 is arranged to be more inward than the end of the first area 102a, the area of the first electrode 5 covered by the first portion 611 may be reduced. Thus, the exposed area of the first electrode 5 may be relatively increased, and the exposed area of the first electrode 5, which may be increased, and the first area 102a may additionally overlap each other. For example, when the blue (B) light of the first stack 71 is emitted toward the first area 102a when the first subpixel P1 emits light, the blue (B) light can transmit the first area 102a, which may be a blue (B) color filter, and a problem may occurs in that a color mixture may be generated. Therefore, in the display device 1, according to the first embodiment of the present disclosure, the end of the first portion 611 may be matched with (e.g., may coextend with) the end of the first area 102a or arranged outside the end of the first area 102a, and the problem of the color mixture may be solved when the first subpixel P1 emits light. For example, the outside may be a direction toward the second portion 612.

The second area 102b may overlap the second subpixel P2. Therefore, when the exposed area of the first electrode 5, which may be not covered by the second fence 62, contributes to formation of an electric field when the second subpixel P2 emits light, the blue (B) light of the first stack 71 and the yellow-green (YG) light of the second stack 73 may be emitted toward the second area 102b of the second color filter 102. For example, when the second color filter 102, which may be a blue color filter, may transmit only the blue (B) light and shields the yellow-green (YG) light, the second subpixel P2 may emit only the blue (B) light.

When the first electrode 5 covered by the second fence 62 cannot contribute to formation of an electric field even in the second subpixel P2, the yellow-green (YG) light may be emitted from the second stack 73 overlapping the second fence 62 due to the leakage current caused by the charge generation layer 72. However, even though the yellow-green (YG) light may be emitted from the second stack 73, when the second area 102b is a blue color filter, the second area 102b may shield the yellow-green (YG) light caused by the leakage current. Therefore, in the display device 1 according to the first embodiment of the present disclosure, even though the yellow-green (YG) light may be emitted due to the leakage current of the charge generation layer 72 when the second subpixel P2 emits light, the second area 102b of the second color filter 102 may shields the yellow-green (YG) light and therefore may transmit only the blue (B) light without a color mixture.

With reference to FIG. 3, the display device 1, according to the first embodiment of the present disclosure, may include a first light-emitting area 7a overlapping the first area 102a. The first light-emitting area 7a may be a portion of the light-emitting layer 7, and may be a portion overlapping the first area 102a in the second stack 73 of the first subpixel P1. As shown in FIG. 3, when the first light-emitting area 7a overlaps the first portion 611 of the first fence 61, the first light-emitting area 7a may emit the yellow-green (YG) light due to the leakage current of the charge generation layer 72 when the first subpixel P1 emits light. However, as described above, when the light emitted from the first light-emitting area 7a is shielded by the first area 102a of the second color filter 102, which may be a blue color filter, the display device 1, according to the first embodiment of the present disclosure, may reduce or prevent a color mixture from being generated.

In the display device 1 according to the first embodiment of the present disclosure, the first area 102a of the second color filter 102 may overlap at least a portion of the first portion 611 of the first fence 61. For example, as described above, the end of the first area 102a may be matched with (e.g., coextend with) the end of the first portion 611. The end of the first area 102a may be arranged to be more inward than the end of the first portion 611. For example, the first area 102a may be relatively smaller than shown in FIG. 2. However, for example, the second color filter 102 may be larger than the first color filter 101 to reduce or prevent a color mixture from being generated, and the second color filter 102 may be overlap the first subpixel P1. Therefore, the display device 1, according to the first embodiment of the present disclosure, may reduce or prevent a color mixture from being generated, even if the second color filter 102, which may be a blue color filter, is not exactly aligned between the first subpixel P1 and the second subpixel P2.

In the first embodiment of the present disclosure, a reason why the trench T may be formed between the first subpixel P1 and the second subpixel P2, and the charge generation layer 72 may be noncontiguous (e.g., disconnected) within the trench T, is to allow the leakage current to not occur between the first subpixel P1 and the second subpixel P2 because a problem in picture quality may occur if the leakage current occurs between the first subpixel P1 and the second subpixel P2. A reason why that the second color filter 102 may be larger than the first color filter 101, and may overlap the first subpixel P1, is that the yellow-green (YG) light may be shielded by the first area 102a of the second color filter 102 to not generate a color mixture, even if the yellow-green (YG) light of the second stack 73 is emitted due to the leakage current of the charge generation layer 72 up to the portion between the first subpixel P1 and the second subpixel P2. For example, the charge generation layer 72 may be completely noncontiguous (e.g., disconnected).

In the display device 1 according to the first embodiment of the present disclosure, if light is emitted from the first subpixel P1, and light is not emitted from the second subpixel P2, as described above, the first color filter 101, overlapping the first electrode 5 exposed from the first fence 61, may transmit the green (G) light, and the first area 102a of the second color filter 102, overlapping the first fence 61, may shield the yellow-green (YG) light. For example, the first area 102a of the second color filter 102 may serve as a black matrix that may shield leakage of light between the first subpixel P1 and the second subpixel P2. Therefore, the display device 1 according to the first embodiment of the present disclosure may be provided with a structure having no black matrix.

Although the display device 1 according to the first embodiment of the present disclosure has been described such that the second stack 73 may include a yellow-green (YG) light-emitting layer, without limitation to this example, the second stack 73 may include a red (R) light-emitting layer and a green (G) light-emitting layer. For example, if the first subpixel P1 emits light, the first color filter 101 may shield the red (R) light and the blue (B) light, and may transmit only the green (G) light, and the first area 102a of the second color filter 102 may reduce or prevent a color mixture from being generated by shielding the red (R) light and the green (G) light.

Figure 4:
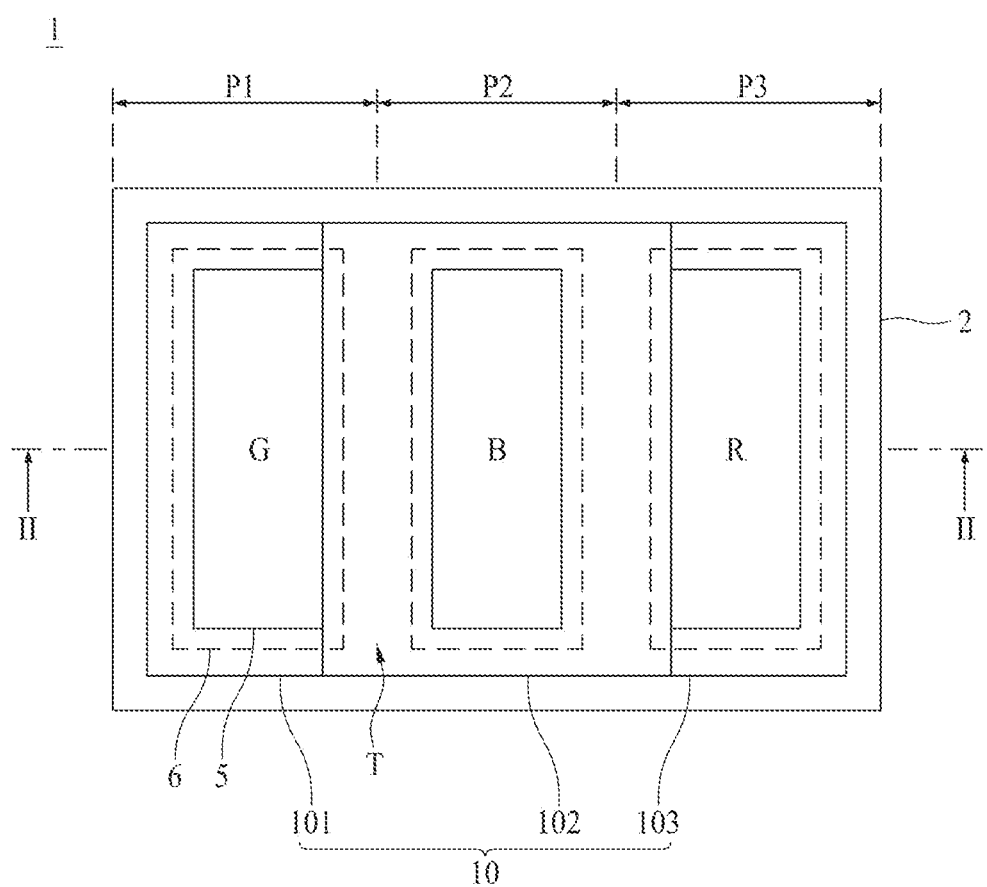
FIG. 4 is a plan view illustrating a display device according to a second embodiment of the present disclosure.
Figure 5:
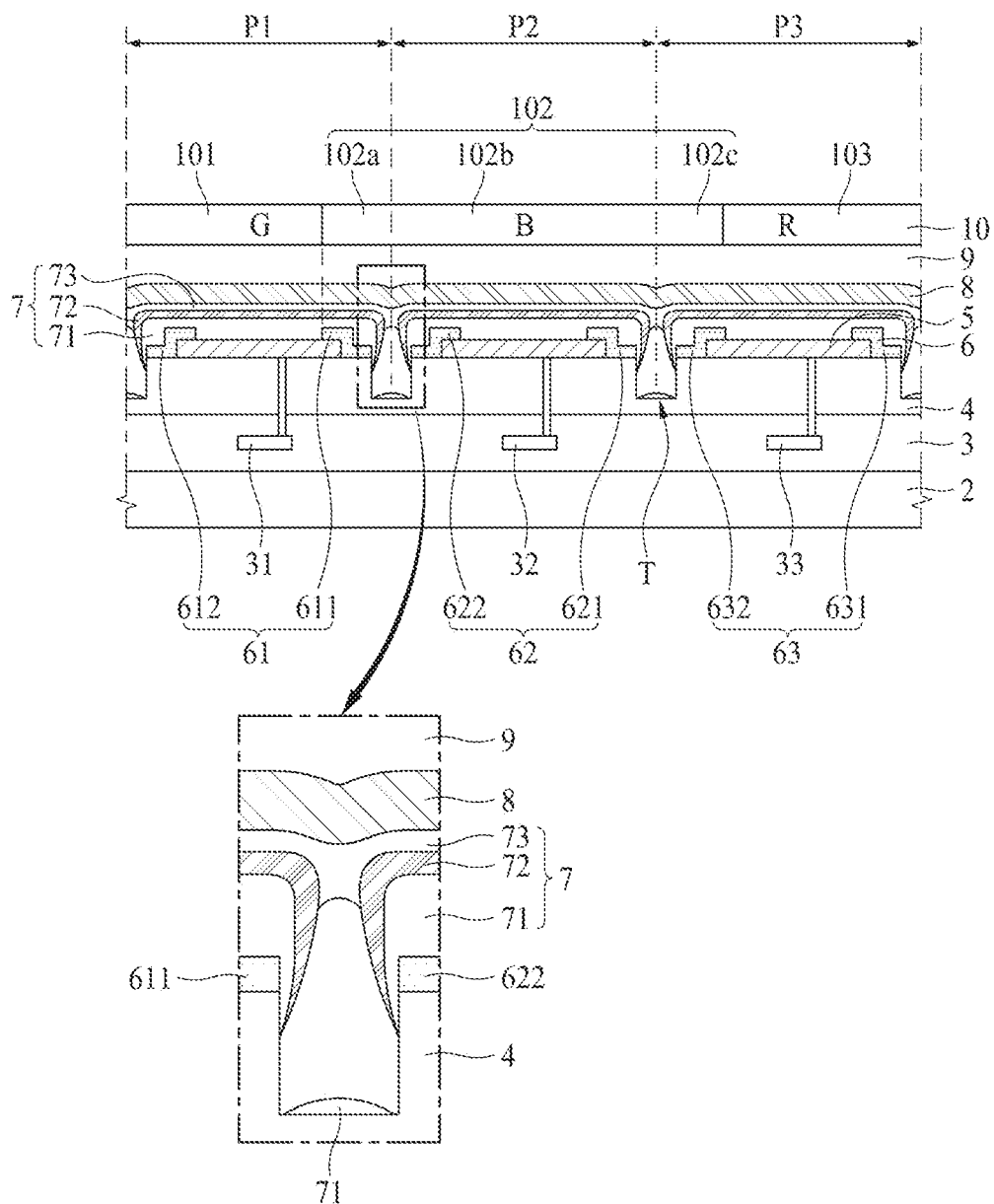
FIG. 5 is a cross-sectional view taken along line II-II shown in FIG. 4.
Figure 6:
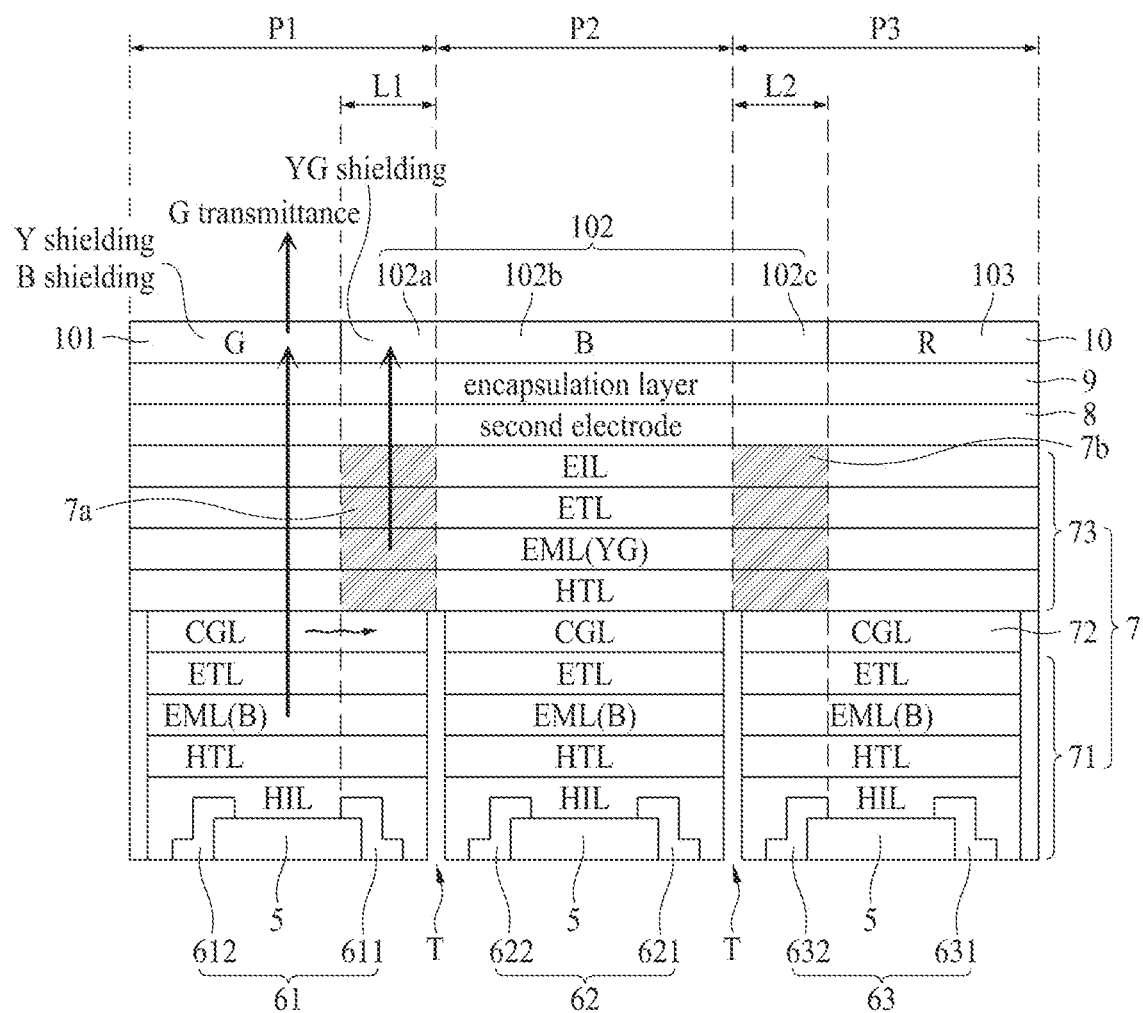
FIGS. 6 and 7 are cross-sectional views illustrating a display device according to the second embodiment of the present disclosure, which includes a light-emitting layer.
Figure 7:
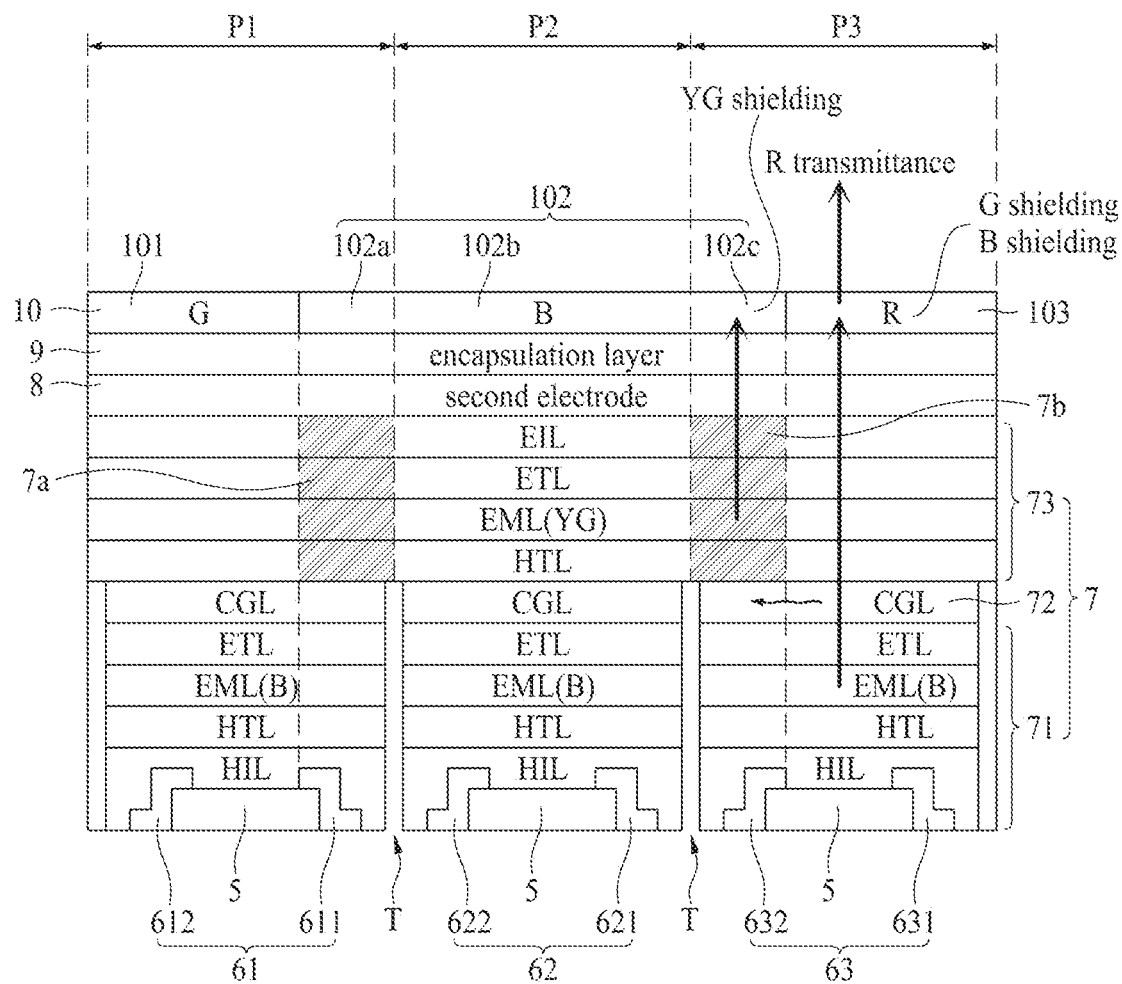

FIG. 4 is a plan view illustrating a display device according to a second embodiment of the present disclosure. FIG. 5 is a cross-sectional view taken along line II-II shown in FIG. 4. FIGS. 6 and 7 are cross-sectional views illustrating a display device according to the second embodiment of the present disclosure, which includes a light-emitting layer.

With reference to the examples of FIGS. 4 to 7, the display device 1 according to the second embodiment of the present disclosure may be substantially similar to the display device described with reference to the examples of FIGS. 1 to 3, except that elements of the second color filter 102 may be modified. Therefore, the same reference numerals are given to the same elements, and only different elements will be described hereinafter.

In the display device 1 according to the second embodiment of the present disclosure, the second color filter 102 may be larger than the third color filter 103, and may overlap the third subpixel P3. Therefore, as shown in FIGS. 4 to 7, the second color filter 102 may partially overlap the third subpixel P3, as well as the first subpixel P1.

FIG. 6 illustrates that the first subpixel P1 may emit light in the display device 1 according to the second embodiment of the present disclosure as an example. FIG. 7 illustrates that the third subpixel P3 may emit light in the display device 1 according to the second embodiment of the present disclosure as an example. In the display device 1 according to the second embodiment of the present disclosure, when the first area 102a of the second color filter 102, overlapping the first subpixel P1 shown in FIG. 6, is substantially similar to that of the display device 1 according to the first embodiment of the present invention, its repeated description will be omitted.

In the display device 1 according to the second embodiment of the present disclosure, the second color filter 102 may further may include a third area 102c overlapping the third subpixel P3. The second portion 632 of the third fence 63 may overlap the third area 102c. For example, as shown in FIGS. 5 to 7, an end of the second portion 632 arranged on the first electrode 5 may be matched with (e.g., may coextend with) an end of the third area 102c of the second color filter 102 adjacent to the third color filter 103. Although not shown, the end of the second portion 632 may be more protruded toward the third color filter 103. For example, at least a portion of the second portion 632 of the fence 63 may overlap the third area 102c of the second color filter 102. Therefore, in the display device 1 according to the second embodiment of the present disclosure, in a similar manner as the first embodiment in which the first subpixel P1 may emit light, the first electrode 5 covered by the second portion 632 may not contribute to formation of an electric field of the light-emitting layer 7 when the third subpixel P3 emits light, the charge generation layer 72 may serve as the first electrode 5 due to a leakage current through the charge generation layer 72, and light may be emitted between the charge generation layer 72 and the second electrode 8.

For example, with reference to FIG. 7, blue (B) light of the first stack 71 and yellow-green (YG) light of the second stack 73 may be emitted toward the third color filter 103, which may be a red (R) color filter, by an electric field formed between the first electrode 5, which may be not covered by the second portion 632, for example, the exposed area of the first electrode 5 and the second electrode 8. The blue (B) light and the green (G) light may be shielded by the third color filter 103, and only the red (R) light may be emitted. When the first electrode 5 covered by the second portion 632 of the third fence 63 cannot contribute to formation of an electric field of the light-emitting layer 7 as described above, only the yellow-green (YG) light of the second stack 73 may be emitted to the third area 102c due to the leakage current of the charge generation layer 72. When the third area 102c is a portion of the second color filter 102, which may be a blue (B) color filter, and therefore may shield the yellow-green (YG) light, no light can transmit the third area 102c. As a result, in the display device 1 according to the second embodiment of the present disclosure, it may be possible to avoid occurrence of a color mixture between the third subpixel P3 and the second subpixel P2 adjacent to the third subpixel P3 due to the leakage current of the charge generation layer 72 when the third subpixel P3 emits light.

The end of the second portion 632 of the third fence 63 may not be arranged to be more inward than the end of the third area 102c adjacent to the third color filter 103. For example, the inside (or "inward") may mean a direction toward the second subpixel P2. If the end of the second portion 632 is arranged to be more inward than the end of the third area 102c, the area of the first electrode 5 covered by the second portion 632 may be reduced. Thus, the exposed area of the first electrode 5 may be relatively increased, and the exposed area of the first electrode 5, which may be increased, and the third area 102c may additionally overlap each other. For example, when the blue (B) light of the first stack 71 is emitted toward the third area 102c when the third subpixel P3 emits light, the blue (B) light can transmit the third area 102c which may be a blue (B) color filter, and a problem may occurs in that a color mixture may be generated. Therefore, in the display device 1 according to the second embodiment of the present disclosure, the end of the second portion 632 of the third fence 63 may be matched with (e.g., coextend with) the end of the third area 102c, or may be arranged outside the end of the third area 102c, and the problem of the color mixture may be solved when the third subpixel P3 emits light. For example, the outside may be a direction toward the first portion 631 of the third fence 63.

With reference to FIGS. 6 and 7, the display device 1, according to the second embodiment of the present disclosure, may include a second light-emitting area 7b overlapping the third area 102c. The second light-emitting area 7b may be a portion of the light-emitting layer 7, and may be a portion overlapping the third area 102c in the second stack 73 of the third subpixel P3. As shown in FIG. 7, when the second light-emitting area 7b overlaps the second portion 632 of the third fence 63, the second light-emitting area 7b may emit the yellow-green (YG) light due to the leakage current of the charge generation layer 72 when the third subpixel P3 emits light. However, as described above, when the light emitted from the second light-emitting area 7b is shielded by the third area 102c of the second color filter 102, which may be a blue color filter, the display device 1 according to the second embodiment of the present disclosure may reduce or prevent a color mixture from being generated.

In the display device 1 according to the second embodiment of the present disclosure, the third area 102c of the second color filter 102 may overlap at least a portion of the second portion 632 of the third fence 63. For example, as described above, the end of the third area 102c may be matched with (e.g., may coextend with) the end of the second portion 632. The end of the third area 102c may be arranged to be more inward than the end of the second portion 632. For example, the third area 102c may be relatively smaller than shown in FIG. 7. However, for example, the second color filter 102 may partially overlap the third subpixel P3 to be larger than the third color filter 103 to reduce or prevent a color mixture from being generated. Therefore, the display device 1 according to the second embodiment of the present disclosure may reduce or prevent a color mixture from being generated even if the second color filter 102, which may be a blue color filter, is not exactly aligned between the second subpixel P2 and the third subpixel P3. For example, a portion between the second subpixel P2 and the third subpixel P3 may mean a half-width of the trench T provided between the second subpixel P2 and the third subpixel P3. For example, the portion between the second subpixel P2 and the third subpixel P3 may mean a center portion of the trench T.

In the second embodiment of the present disclosure, a reason why the trench T may be formed between the second subpixel P2 and the third subpixel P3 and the charge generation layer 72 may be noncontiguous (e.g., disconnected) within the trench T may be to not allow the leakage current to occur between the second subpixel P2 and the third subpixel P3 because a problem in picture quality may occur if the leakage current occurs between the second subpixel P2 and the third subpixel P3. A reason why that the second color filter 102 may be larger than the third color filter 103, and may overlap the third subpixel P3 may be that the yellow-green (YG) light may be shielded by the third area 102c of the second color filter 102 to not generate a color mixture, even though the yellow-green (YG) light of the second stack 73 may be emitted due to the electric field formed by the leakage current of the charge generation layer 72 up to the portion between the second subpixel P2 and the third subpixel P3. For example, the charge generation layer 72 may be completely noncontiguous (e.g., disconnected).

In the display device 1 according to the second embodiment of the present disclosure, if light is emitted from the third subpixel P3, and light is not emitted from the second subpixel P2, as described above, the third color filter 103 overlapping the first electrode 5, exposed from the third fence 63, may transmit the red (R) light, and the third area 102c of the second color filter 102, overlapping the third fence 63, may shield the yellow-green (YG) light. For example, the third area 102c of the second color filter 102 may serve as a black matrix that may shield leakage of light between the second subpixel P2 and the third subpixel P3. Therefore, the display device 1 according to the second embodiment of the present disclosure may be provided with a structure having no black matrix between the first subpixel P1 and the second subpixel P2, and between the second subpixel P2 and the third subpixel P3.

Although the display device 1 according to the second embodiment of the present disclosure has been described based on that the second stack 72 may include a yellow-green (YG) light-emitting layer, without limitation to this example, the second stack 72 may include a red (R) light-emitting layer and a green (G) light-emitting layer. For example, if the third subpixel P3 emits light, the third color filter 103 may shield the green (G) light and the blue (B) light and transmit only the red (R) light, and the third area 102c of the second color filter 102 may reduce or prevent a color mixture from being generated by shielding the red (R) light and the green (G) light.

Figure 9:
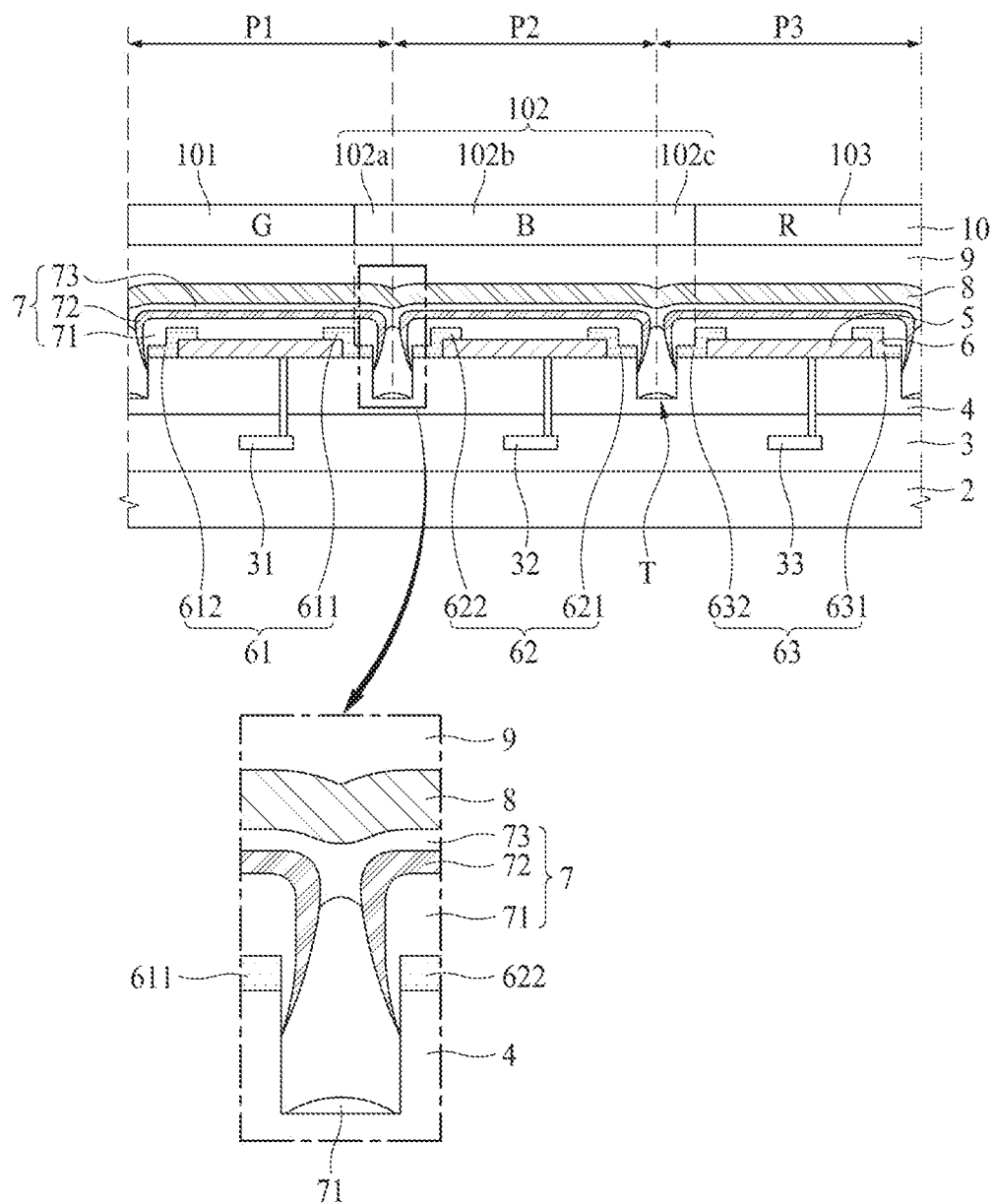
FIG. 9 is a cross-sectional view illustrating a second color filter partially overlapping a fence in a display device according to the third embodiment of the present disclosure.

With further reference to FIG. 6, in the display device 1 according to the second embodiment of the present disclosure, the first area 102a of the second color filter 102 may have a first length L1, and the third area 102c of the second color filter 102 may have a second length L2. For example, the first length L1 of the first area 102a may mean a distance between an end of one side of the first area 102a, and an end of the other side of the first area 102a. The end of one side of the first area 102a may be matched with (e.g., may coextend with) the half of the trench T provided between the first subpixel P1 and the second subpixel P2, for example, the center portion of the trench T. For example, the end of one side of the first area 102a may be a boundary surface of the first subpixel P1 and the second subpixel P2. The end of the other side of the first area 102a may be matched with (e.g., may coextend with) the end of the first portion 611 of the first fence 61. However, without limitation to this example, as shown in FIG. 9, the end of the other side of the first area 102a may overlap a portion of the first portion 611 of the first fence 61.

The second length L2 of the third area 102c may mean a distance between an end of one side of the third area 102c and an end of the other side of the third area 102c. The end of one side of the third area 102c may be matched with (e.g., may coextend with) the end of the second portion 632 of the third fence 63. The end of the other side of the third area 102c may be matched with (e.g., may coextend with) the half of the trench T provided between the second subpixel P2 and the third subpixel P3, for example, the center portion of the trench T. For example, the end of the other side of the third area 102c may be a boundary surface of the second subpixel P2 and the third subpixel P3. However, without limitation to this example, as shown in FIG. 9, the end of one side of the third area 102c may overlap a portion of the third portion 632 of the third fence 63.

In the display device 1 according to the second embodiment of the present disclosure, the first length L1 and the second length L2 may be equal to each other. Therefore, a light shielding area of the first area 102a that shields the yellow-green (YG) light of the second stack 73, which may be caused by the leakage current when the first subpixel P1 emits light, may be equal to a light shielding area of the third area 102c that shields the yellow-green (YG) light of the second stack 73, which may be caused by the leakage current when the third subpixel P3 emits light. For example, the light shielding area due to the leakage current may be the same size at both sides based on the second subpixel P2. Therefore, in the display device 1 according to the second embodiment of the present disclosure, the first color filter 101 and the third color filter 103 may be symmetrical to each other about the second color filter 102. For example, when the second color filter 102 is a blue color filter, the second color filter 102 may have a light intensity that is relatively lower than the respective light intensities of the first color filter 101 and the third color filter 103. Therefore, in the display device 1 according to the second embodiment of the present disclosure, the second color filter 102 may be larger than the first color filter 101 and the third color filter 103, which may be arranged at both sides of the second color filter 102, but may allow a user not to easily recognize a difference in size due to low light intensity.

In the display device 1 according to the second embodiment of the present disclosure, the first length L1 and the second length L2 may be different from each other. Therefore, the size of the light shielding area of the first area 102a that shields the yellow-green (YG) light of the second stack 73, which may be caused by the leakage current when the first subpixel P1 emits light, may be different from that of the light shielding area of the third area 102c that shields the yellow-green (YG) light of the second stack 73, which may be caused by the leakage current when the third subpixel P3 emits light. Therefore, in the display device 1 according to the second embodiment of the present disclosure, the first color filter 101 and the third color filter 103 may be asymmetrical to each other about the second color filter 102. For example, when the first length L1 and the second length L2 are different from each other, the first to third color filters 101, 102, and 103 may be different from one another in size.

For example, when the second color filter 102, which may be a blue color filter, has light intensity relatively lower than that of each of the first color filter 101, which may be a green color filter, and the third color filter 103, which may be a red color filter, the second color filter 102 may have a size relatively larger than that of each of the first color filter 101 and the third color filter 103. Meanwhile, when the first color filter 101, which may be a green color filter, has light intensity relatively lower than that of the third color filter 103, which may be a red color filter, the first color filter 101 may have a size relatively larger than that of the third color filter 103. As a result, in the display device 1 according to the second embodiment of the present disclosure, the first length L1 may be shorter than the second length L2, and may become shorter in the order of the second color filter 102, the first color filter 101 and the third color filter 103, and a user may not easily recognize a difference in size of each color when each of the subpixels P1, P2, and P3 emits light. For example, a reference position of the first length L1 and the second length L2, which may be respectively increased or reduced, may be a half position of the trench T provided between the respective subpixels P1, P2, and P3. For example, the reference position may be a boundary surface between the respective subpixels P1, P2, and P3.

Figure 8:
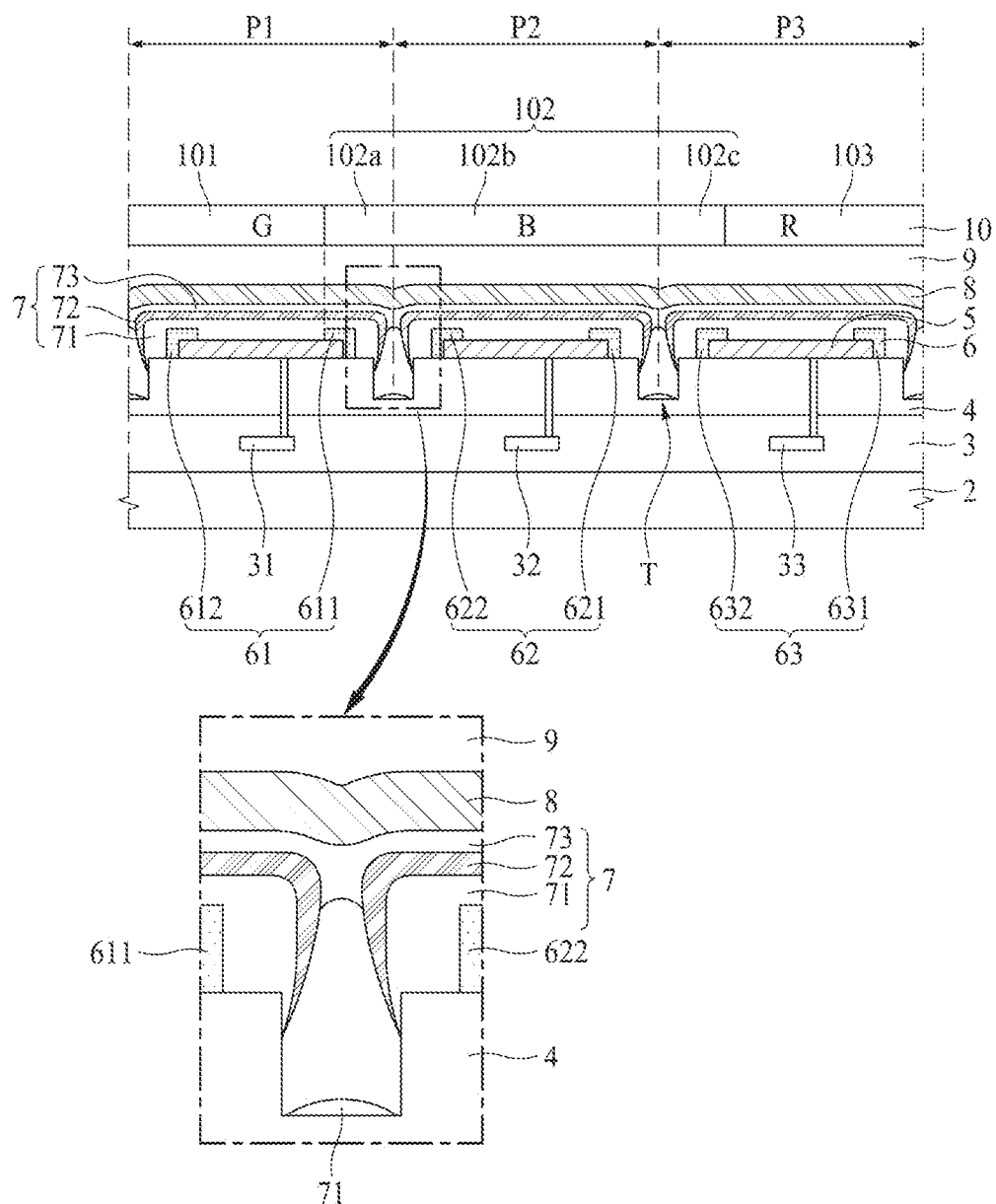
FIG. 8 is a plan view illustrating a display device according to a third embodiment of the present disclosure.

FIG. 8 is a plan view illustrating a display device according to a third embodiment of the present disclosure.

With reference to FIG. 8, the display device 1 according to the third embodiment of the present disclosure may be substantially similar to the display device according to FIG. 5, except that a structure of the fence 6 may be modified. Therefore, only elements different from those of FIG. 5 will be described hereinafter.

According to FIG. 5, the first fence 61, the second fence 62, and the third fence 63 may respectively be provided to adjoin the trench T. For example, after the fence 6 is entirely formed among the subpixels P1, P2, and P3, the fence 6 and a predetermined area of the insulating layer 4 below the fence 6 may be removed between the first subpixel P1 and the second subpixel P2, and between the second subpixel P2 and the third subpixel P3 to form the trench T. Therefore, the trench T may be formed together with the fence 6 and the insulating layer 4 below the fence 6.

On the other hand, according to FIG. 8, the first to third fences 61, 62, and 63, provided to cover the end of the first electrode 5, may be formed to be patterned for each of the subpixels P1, P2, and P3. Therefore, each of the first to third fences 61, 62, and 63 may not adjoin the trench T.

Figure 10:
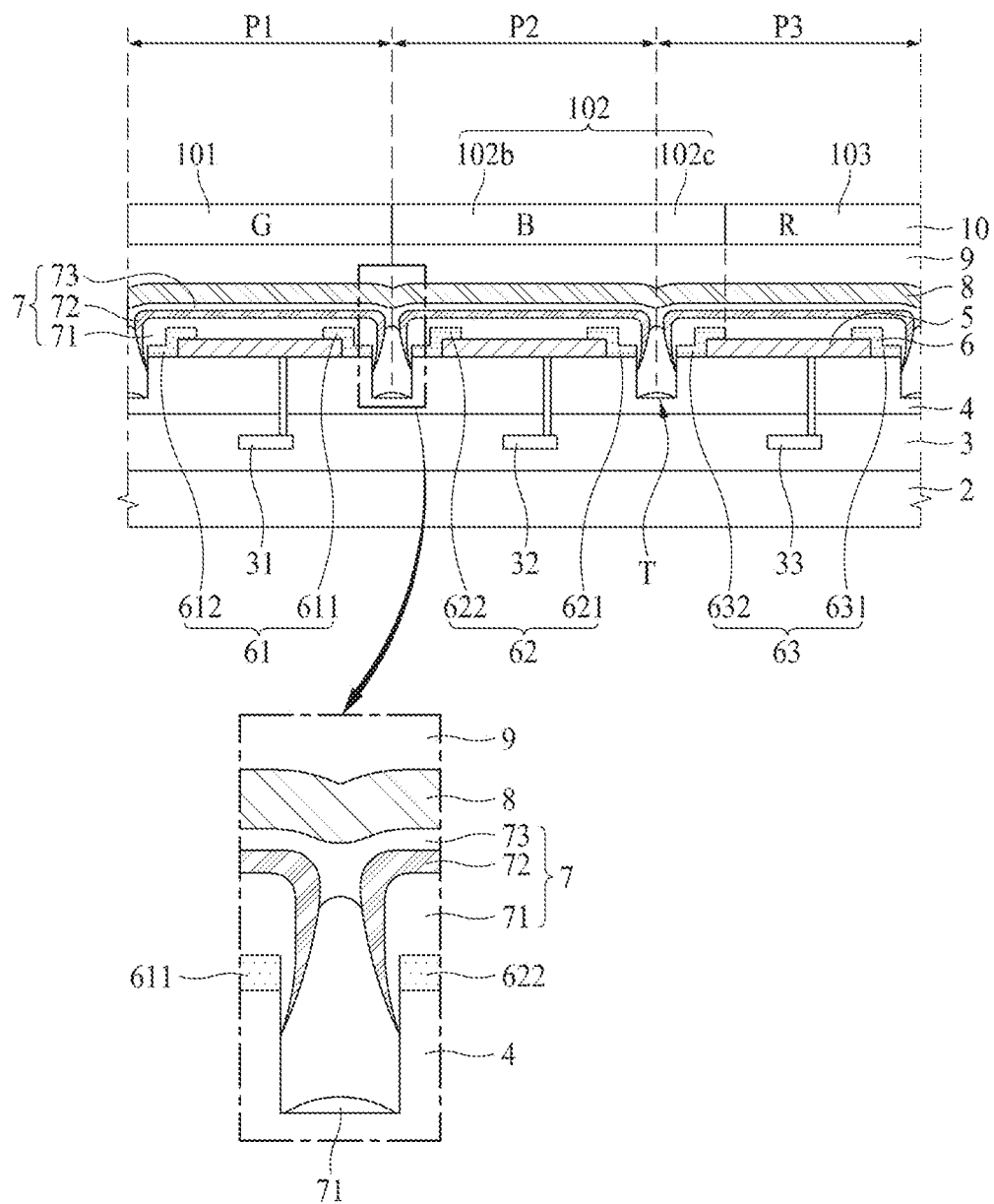
FIG. 10 is a cross-sectional view illustrating a shift of a second color filter of FIG. 9.
Figure 11:
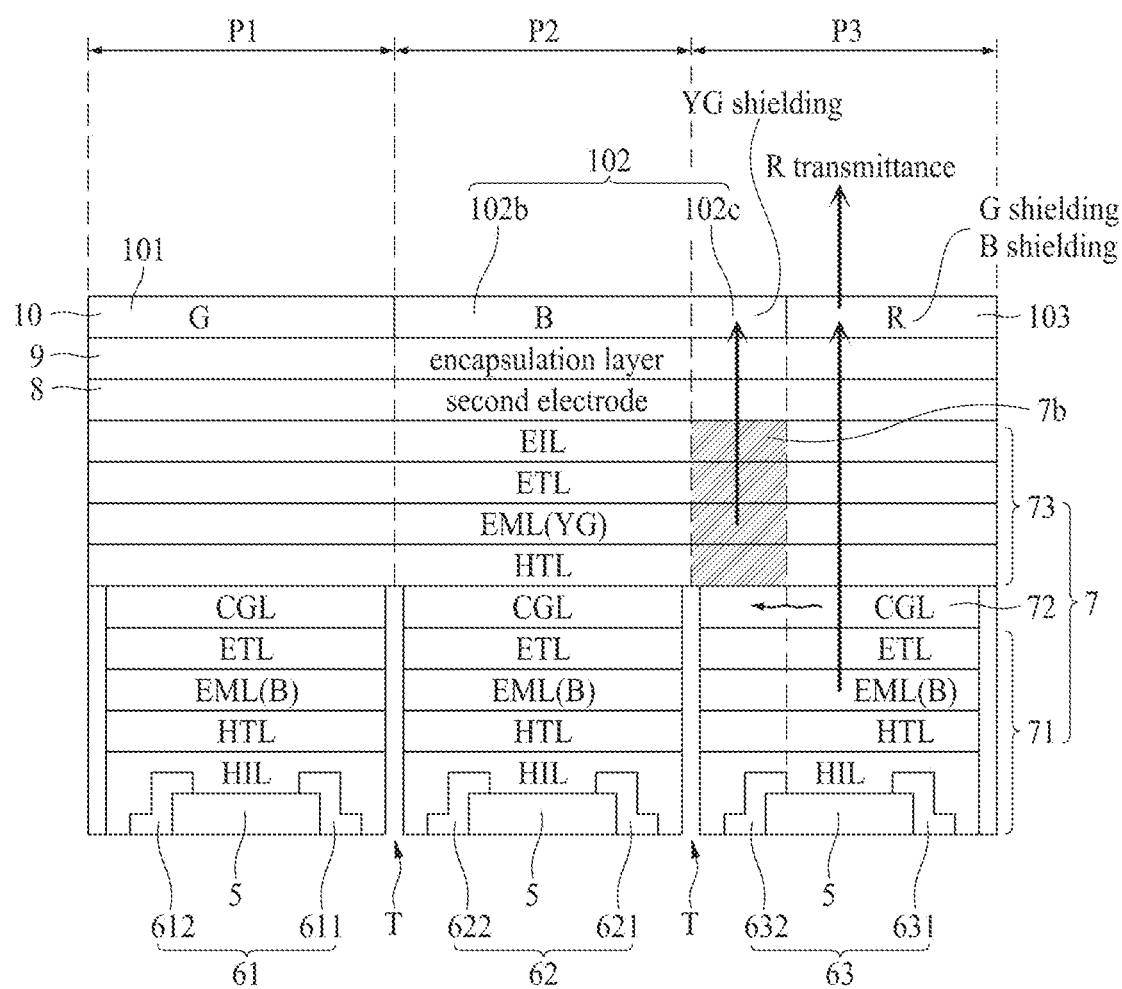
FIG. 11 is a cross-sectional view illustrating a display device according to the third embodiment of the present disclosure, which includes a light-emitting layer.

FIG. 9 is a cross-sectional view illustrating a second color filter partially overlapping a fence in a display device according to the third embodiment of the present disclosure. FIG. 10 is a cross-sectional view illustrating a shift of a second color filter of FIG. 9. FIG. 11 is a cross-sectional view illustrating a display device according to the third embodiment of the present disclosure, which includes a light-emitting layer.

With reference to the examples of FIGS. 9 to 11, in the display device 1 according to the third embodiment of the present disclosure, the second color filter 102 may overlap a portion of the first portion 611 of the first fence 61 and a portion of the second portion 632 of the third fence 63. For example, as shown in FIG. 9, the other side of the first area 102*a* of the second color filter 102 may overlap the first portion 611, which may be in contact with an upper surface of the insulating layer 4, without being in contact with the first electrode 5. One side of the third area 102*c* of the second color filter 102 may overlap the second portion 632, which may be in contact with the upper surface of the insulating layer 4, without being in contact with the first electrode 5. However, without limitation to this example, the other side of the first area 102*a* may be formed up to the center portion of the trench T. For example, as shown in FIG. 10, the second color filter 102 may not may include the first area 102*a*. Also, one side of the third area 102*c* may be formed up to the center portion of the trench T. For example, although not shown, the second color filter 102 may not may include the third area 102*c*. For example, even when the second color filter 102 overlaps the portion of the first portion 611 of the first fence 61 and the portion of the second portion 632 of the third fence 63, as described above, the display device 1 according to the third embodiment of the present disclosure may reduce or prevent a color mixture from being generated because the yellow-green (YG) light of the second stack 73, which may be caused by the leakage current when the first subpixel P1 emits light, may be shielded by the first area 102*a*, and may reduce or prevent a color mixture from being generated because the yellow-green (YG) light of the second stack 73, which may be caused by the leakage current when the third subpixel P3 emits light, may be shielded by the third area 102*c*.

Although FIG. 9 illustrates that the first area 102*a* and the third area 102*c* of the second color filter 102 may be symmetrical to each other about the second area 102*b*, without limitation to this example, the first area 102*a* and the third area 102*c* may be asymmetrical to each other in such a manner that any one of them may be larger than or smaller than the other one. Even for example, the yellow-green (YG) light of the second stack 73, which may be caused by the leakage current when the first subpixel P1 emits light, may be shielded by the first area 102*a* and the yellow-green (YG) light of the second stack 73, which may be caused by the leakage current when the third subpixel P3 emits light, may be shielded by the third area 102*c*, whereby a color mixture may be reduced or prevented from being generated.

However, it should be noted that the first area 102*a* or the third area 102*c* may not overlap the first electrode 5, which may be not covered by the fence of the subpixel adjacent thereto, even when the first area 102*a* or the third area 102*c* is larger toward the subpixel adjacent thereto. This may be because that the green (G) light and the blue (B) light may be mixed with each other when the first subpixel P1 emits light if the first area 102*a* overlaps the exposed first electrode 5 of the first subpixel P1 adjacent thereto, and the red (R) light and the blue (B) light may be mixed with each other when the third subpixel P3 emits light if the third area 102*c* overlaps the exposed first electrode 5 of the third subpixel P3 adjacent thereto.

FIG. 10 illustrates that the second color filter of FIG. 9 may be shifted to the third subpixel P3 at a predetermined distance. With reference to FIGS. 10 and 11, one side of the second color filter 102 may overlap the third subpixel P3, and the other side of the second color filter 102 may be provided between the first subpixel P1 and the second subpixel P2, e.g., the center portion of the trench T.

First, when the other side of the second color filter 102 is arranged in the center portion of the trench T provided between the first subpixel P1 and the second subpixel P2, the second color filter 102 may not include the first area 102*a* of FIG. 9. However, for example, when the yellow-green (YG) light of the second stack 73, which may be caused by the leakage current when the first subpixel P1 emits light, is headed toward the first color filter 101, which may be a green color filter, the first subpixel P1 may emit light of its original color. When the yellow-green (YG) light of the second stack 73, which may be caused by the leakage current when the second subpixel P2 emits light, is headed toward the second color filter 102, which may be a blue color filter, the yellow-green (YG) light may be shielded. Therefore, the display device 1 according to the third embodiment of the present disclosure may reduce or prevent a color mixture from being generated.

Next, as shown in FIG. 10, as the second color filter 102 may be shifted to the third subpixel P3, one side of the second color filter 102 may overlap the third subpixel P3. For example, one side of the second color filter 102 may overlap a portion of the second portion 632 of the third fence 63. However, one side of the second color filter 102 may not overlap the first electrode 5 of the third subpixel P3, which may be not covered by the second portion 632, beyond the second portion 632 of the third fence 63. For example, when one side of the second color filter 102 overlapping the portion of the second portion 632 of the third fence 63 shields the yellow-green (YG) light of the second stack 73, which may be caused by the leakage current when the third subpixel P3 emits light, as described above, a color mixture may be reduced or prevented from being generated.

If the second color filter 102 is shifted, and one side of the second color filter 102 overlaps the first electrode 5 of the third subpixel P3, which may be not covered by the second portion 632 of the third fence 63, the blue (B) light of the first stack 71 and the yellow-green (YG) light of the second stack 73 may be emitted, and then may move toward the portion overlapping the first electrode 5 when the third subpixel P3 emits light. For example, the yellow-green (YG) light may be shielded by the overlapping portion of the second color filter 102, which may be a blue color filter, but the blue (B) light may transmit the overlapping portion of the second color filter 102, which may be a blue color filter. As a result, if the second color filter 102 is shifted and overlaps the exposed first electrode 5 of the third subpixel P3, the blue (B) light may be transmitted through the overlapped portion when the third subpixel P3 emits light, and a problem may occur in that the red (R) light and the blue (B) light may be emitted together from the third subpixel P3 to cause a color mixture. Therefore, in the display device 1 according to the third embodiment of the present disclosure, even though the second color filter 102 may be shifted, the second color filter 102 may not be shifted to exceed the end of the second portion 632 of the third fence 63 in the third subpixel P3.

Even if the second color filter 102 is shifted as above, the end of the other side of the second color filter 102, for example, the end of the second area 102b arranged between the first subpixel P1 and the second subpixel P2 in the example of FIG. 10, may overlap at least the center portion of the trench T or the first subpixel P1. This may be because that there may be no problem when the first subpixel P1 emits light, but the green (G) light may be emitted due to the leakage current occurring when the second subpixel P2 emits light, and may generate a color mixture with the blue (B) light, if the end of the other side of the second color filter 102 is shifted by departing from the center portion of the trench T and moving toward the third subpixel P3.

As such, in the display device 1 according to the third embodiment of the present disclosure, if the second color filter 102 is shifted to the subpixel adjacent thereto, one side of the second color filter 102 provided toward the shifted direction may not exceed the end of the initial fence arranged in the subpixel provided toward the shifted direction, and the other side of the second color filter 102 may be shifted within the range that does not exceed the center portion of the trench T provided between the subpixels, to reduce or prevent a color mixture being generated between the subpixels adjacent to each other.

Although an example in which the second color filter 102 is shifted to the third subpixel P3 has been described with reference to FIGS. 10 and 11, without limitation to this example, a similar effect of the display device 1 according to the present disclosure may be applied to when the second color filter 102 is shifted to the first subpixel P1. Meanwhile, in the display device 1 according to the present disclosure, as the second color filter 102 provided in the second subpixel P2 may be the same size or larger than the second subpixel P2, it may be possible to easily solve the problem of the color mixture generated when the second color filter 102 is smaller than the second subpixel P2.

Figure 12:
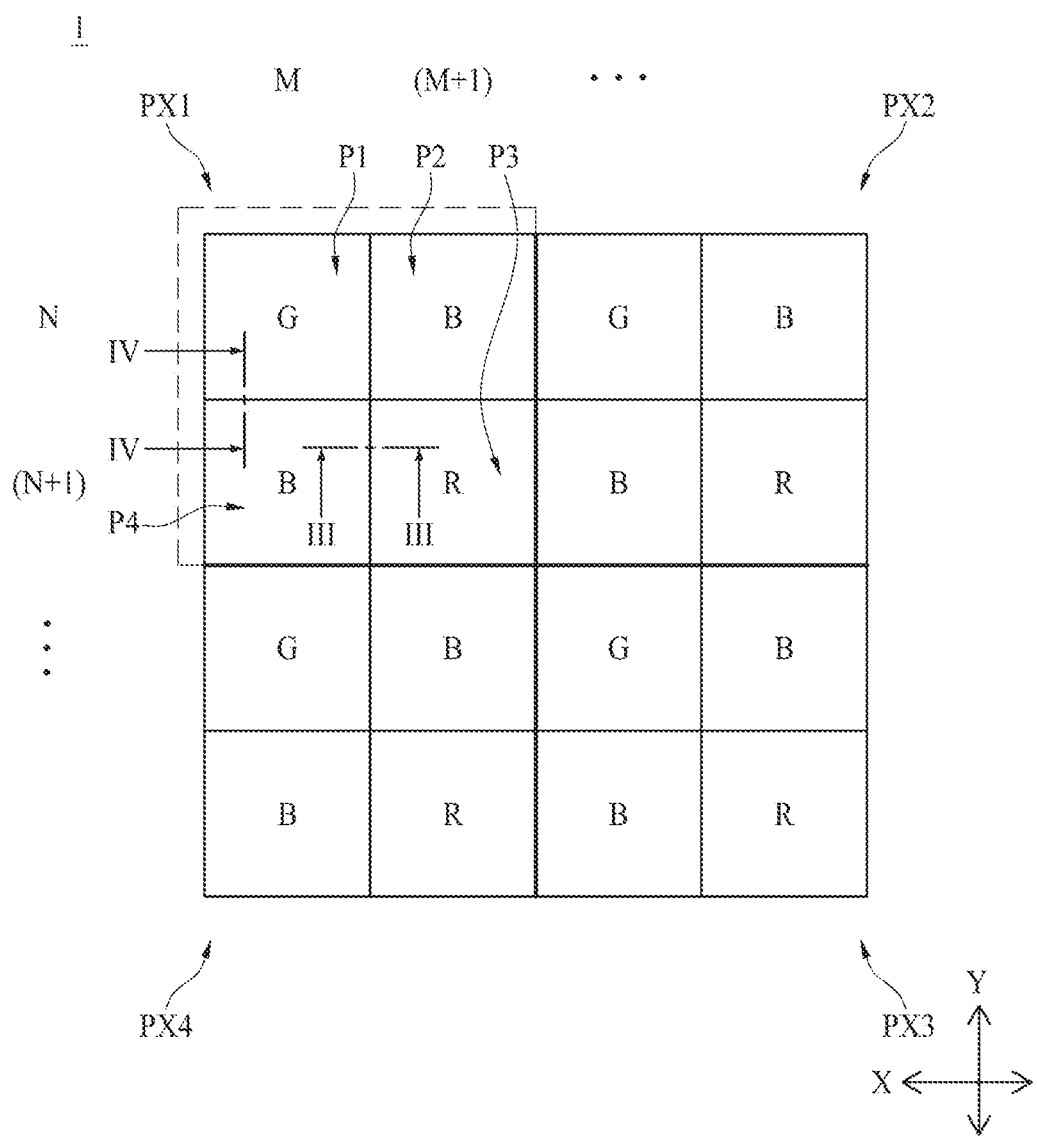
FIG. 12 is a plan view illustrating a display device according to a fourth embodiment of the present disclosure.
Figure 13:
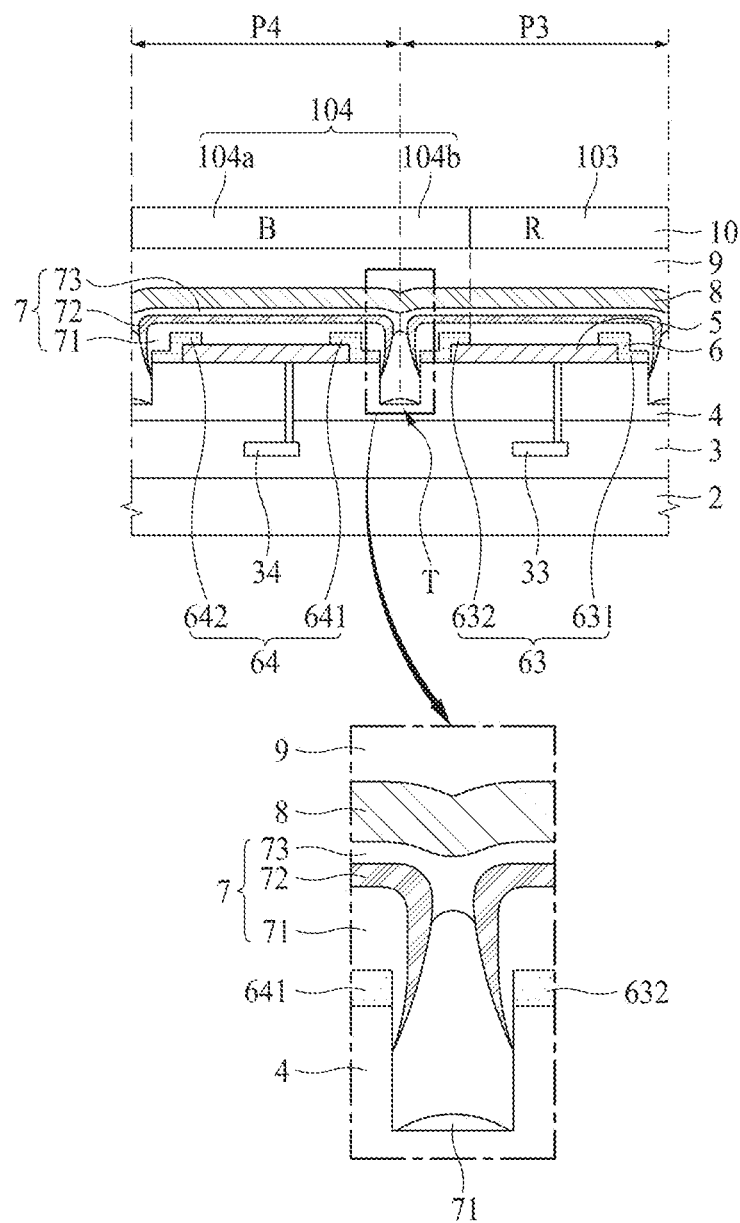
FIG. 13 is a cross-sectional view illustrating one embodiment taken along line III-III shown in FIG. 12.
Figure 14:
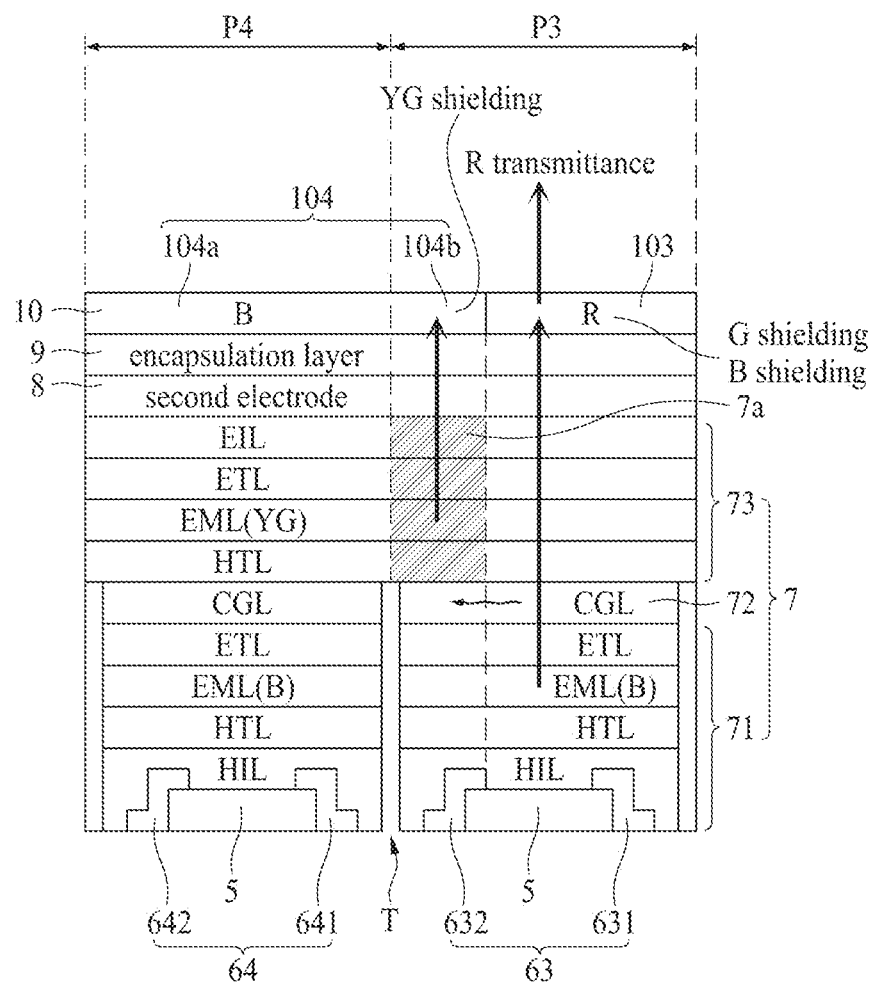
FIG. 14 is a cross-sectional view illustrating a display device including a light-emitting layer of FIG. 13.

FIG. 12 is a plan view illustrating a display device according to a fourth embodiment of the present disclosure. FIG. 13 is a cross-sectional view illustrating one embodiment taken along line III-III shown in FIG. 12. FIG. 14 is a cross-sectional view illustrating a display device including a light-emitting layer of FIG. 13.

With reference to the examples of FIGS. 12 to 14, the display device 1 according to the fourth embodiment of the present disclosure may be substantially similar to the display device according to FIG. 1, except that the substrate 2 may further include a fourth subpixel P4, and an arrangement of the first to third subpixels P1, P2, and P3 may be modified. Therefore, the same reference numerals are given to the same elements, and only different elements will be described hereinafter.

In the display device 1 according to FIG. 1, the first to third subpixels P1, P2, and P3 may be arranged in a first axis direction (e.g., X-axis direction) in a line. For example, the first to third subpixels P1, P2, and P3 may constitute one pixel. Although not shown, the display device 1 of the present disclosure may be embodied in such a manner that a plurality of pixels may be arranged continuously along a first axis direction (e.g., X-axis direction) and a second axis direction (e.g., Y-axis direction). Therefore, along the first axis direction (e.g., X-axis direction) of the first to third subpixels P1, P2, and P3 constituting one pixel, first to third subpixels of another pixel may be arranged, and along the second axis direction (e.g., Y-axis direction) of the first to third subpixels P1, P2, and P3 constituting one pixel, first to third subpixels of another pixel may be arranged. As a result, if the first to third subpixels P1, P2, and P3 are respectively provided to emit green light, blue light, and red light, light of different colors may be alternately arranged along the first axis direction (e.g., X-axis direction) in the order of green light, blue light, and red light, and light of the same color may be arranged along the second axis direction (e.g., Y-axis direction). For example, the first axis direction (e.g., X-axis direction) may mean a row direction, and the second axis direction (e.g., Y-axis direction) may mean a column direction. For example, a red light subpixel of a first pixel and a green light subpixel of a second pixel may be adjacent to each other along the first axis direction (e.g., X-axis direction). For example, even though any one of the red light subpixel of the first pixel and the green light subpixel of the second pixel may overlap the subpixel adjacent thereto, it may have no option but to transmit any one of yellow-green (YG) light of the second stack, and a color mixture may be generated between the red light subpixel of the first pixel and the green light subpixel of the second pixel. To solve this problem, in the display device 1 according to the fourth embodiment of the present disclosure, a fourth subpixel emitting blue light may be additionally provided, an arrangement structure of the first to fourth subpixels may be modified, and the problem of the color mixture may be solved.

For example, in the display device according to FIG. 12, one pixel may be provided with a first subpixel P1, a second subpixel P2, a third subpixel P3, and a fourth subpixel P4, and the first to fourth subpixels P1, P2, P3, and P4 may be arranged in a clockwise direction. For example, the first subpixel P1 may emit green light, the second subpixel P2 may emit blue light, the third subpixel P3 may emit red light, and the fourth subpixel P4 may emit blue light. For example, the second subpixel P2 and the fourth subpixel P4 may emit light of the same color, e.g., blue light. Therefore, as shown in FIG. 12, the third subpixel P3, provided to emit red light, with respect to the first subpixel P1, provided to emit green light, may not be arranged in the first axis direction (e.g., X-axis direction) and the second axis direction (e.g., Y-axis direction).

Also, if a second pixel PX2, a third pixel PX3 and a fourth pixel PX4, which may each have a substantially similar structure to that of a first pixel PX1 provided with the first subpixel P1, the second subpixel P2, the third subpixel P3 and the fourth subpixel P4, are arranged in a clockwise direction, as shown in FIG. 12, the first subpixel (e.g., the first subpixel P1) of the third pixel PX3, provided to emit green light, may be surrounded by the second subpixel (e.g., the second subpixel P2) and the fourth subpixel (e.g., the fourth subpixel P4), which may emit blue light. Likewise, the third subpixel (e.g., the third subpixel P3) of the first pixel PX1, provided to emit red light, may be surrounded by the second subpixel (e.g., the second subpixel P2) and the fourth subpixel (e.g., the fourth subpixel P4), which may emit blue light. For example, a subpixel provided to emit green light and a subpixel provided to emit red light may be surrounded by second subpixels and fourth subpixels provided to emit blue light. Therefore, in the display device 1 according to the fourth embodiment of the present disclosure, the subpixel provided to emit green light and the subpixel provided to emit red light may not adjoin each other in the first axis direction (e.g., X-axis direction) and the second axis direction (e.g., Y-axis direction), and the problem of the color mixture of red and green may be avoided.

With further reference to FIG. 12, the first subpixel P1, provided to emit green light, and the second subpixel P2, provided to emit blue light, may be alternately arranged in the $N^{th}$ row, where N is an integer greater than 0. For example, the first subpixel P1, provided to emit green light, and the second subpixel P2, provided to emit blue light, may be alternately arranged in the first row of FIG. 12. For example, the blue color filter provided in the second subpixel P2 may overlap the first subpixel P1. Therefore, a color mixture may be reduced or prevented from occurring between the first subpixel P1 and the second subpixel P2.

The fourth subpixel P4, provided to emit blue light, and the third subpixel P3, provided to emit red light, may be alternately arranged in the (N+1)$^{th}$ row, where N is an integer greater than 0. For example, the fourth subpixel P4, provided to emit blue light, and the third subpixel P3, provided to emit red light, may be alternately arranged in the second row of FIG. 12. For example, the blue color filter provided in the fourth subpixel P4 may overlap the third subpixel P3. Therefore, a color mixture may be reduced or prevented from being generated between the third subpixel P3 and the fourth subpixel P4.

As shown in FIG. 12, the first subpixel P1, provided to emit green light, and the fourth subpixel P4, provided to emit blue light, may be alternately arranged in the M$^{th}$ column, where M is an integer greater than 0. For example, the first subpixel P1, provided to emit green light, and the fourth subpixel P4, provided to emit blue light, may be alternately arranged in the first column of FIG. 12. For example, the blue color filter provided in the fourth subpixel P4 may overlap the first subpixel P1. Therefore, a color mixture may be reduced or prevented from being generated between the first subpixel P1 and the fourth subpixel P4.

The second subpixel P2, provided to emit blue light, and the third subpixel P3, provided to emit red light, may be alternately arranged in the (M+1)$^{th}$ column, where M is an integer greater than 0. For example, the second subpixel P2, provided to emit blue light, and the third subpixel P3, provided to emit red light, may be alternately arranged in the second column of FIG. 12. For example, the blue color filter provided in the second subpixel P2 may overlap the third subpixel P3. Therefore, a color mixture may be reduced or prevented from being generated between the second subpixel P2 and the third subpixel P3.

Therefore, in the display device 1 according to the fourth embodiment of the present disclosure, the subpixel provided to emit green light and the subpixel provided to emit red light may not be arranged in the first axis direction (e.g., X-axis direction) and the second axis direction (e.g., Y-axis direction). Thus, a color mixture may be avoided.

FIG. 13 illustrates one embodiment of a cross-sectional view taken line III-III of FIG. 12. In FIG. 13, a size of the fourth color filter 104 in the fourth subpixel P4 may be larger than that of the third color filter 103, and may partially overlap the third subpixel P3.

With reference to FIG. 13, the trench T may be provided between the fourth subpixel P4 and the third subpixel P3, and may reduce or prevent a leakage current from occurring between the subpixels P3 and P4 adjacent to each other by disconnecting a portion of the light-emitting layer of the fourth subpixel P4 and the third subpixel P3. However, for example, when the light-emitting layer is partially formed up to the light-emitting layer and is completely disconnected (e.g., noncontiguous) between the subpixels P3 and P4, the leakage current may occur up to the portion where the light-emitting layer is formed.

Therefore, in the display device 1 according to the fourth embodiment of the present disclosure, when the fourth color filter 104 partially overlaps the third subpixel P3, it may be possible to avoid a color mixture caused by a leakage current occurring when the third subpixel P3 emits red light. For example, the fourth color filter 104 may be larger than the third color filter 103, and one side of the fourth color filter 104 may overlap the third subpixel P3.

With reference to FIG. 14, a third fence 63, surrounding an edge of the first electrode 5, may be provided in the third subpixel P3, and may adjoin the trench T provided between the third subpixel P3 and the fourth subpixel P4. The third fence 63 may include a first portion 631 overlapping one side of the first electrode 5 of the third subpixel P3, and a second portion 632 overlapping the other side of the first electrode 5. As shown in FIG. 14, the first portion 631 of the third fence 63 may overlap a right portion of the first electrode 5, the second portion 632 of the third fence 63 may overlap a left portion of the first electrode 5, and the first portion 631 and the second portion 632 may be spaced apart from each other. A portion in which the first and second portions 631 and 632 are spaced apart from each other may be the light-emitting area of the third subpixel P3.

Likewise, a fourth fence 64, surrounding an edge of the first electrode 5, may be provided in the fourth subpixel P4, and may adjoin the trench T provided between the fourth subpixel P4 and the third subpixel P3. The fourth fence 64 may include a first portion 641 overlapping one side of the first electrode 5 of the fourth subpixel P4, and a second portion 642 overlapping the other side of the first electrode 5. As shown in FIG. 14, the first portion 641 of the fourth fence 64 may overlap the right portion of the first electrode 5, the second portion 642 of the fourth fence 64 may overlap the left portion of the first electrode 5. The first portion 641 and the second portion 642 may be spaced apart from each other. A portion in which the first and second portions 641 and 642 are spaced apart from each other may be the light-emitting area of the fourth subpixel P4.

The fourth color filter 104 may include a first area 104a overlapping the fourth subpixel P4, and a second area 104b overlapping the third subpixel P3. The second portion 632 of the third fence 63 may overlap the second area 104b. For example, as shown in FIG. 14, an end of the second portion 632, arranged on the first electrode 5, may be matched with (e.g., coextend with) an end of the second area 104b of the fourth color filter 104 adjacent to the third color filter 103. Although not shown, the end of the second portion 632 may be more protruded toward the third color filter 103. For example, at least a portion of the second portion 632 may overlap the second area 104b of the fourth color filter 104. Therefore, the first electrode 5, covered by the second portion 632, may not contribute to formation of an electric field of the light-emitting layer 7 when the third subpixel P3 emits light, and the charge generation layer 72 may serve as the first electrode 5 due to a leakage current through the charge generation layer 72. Thus, light may be emitted between the charge generation layer 72 and the second electrode 8.

For example, blue (B) light and yellow-green (YG) light may be emitted toward the third color filter 103, which may be a red color filter, by an electric field formed between the first electrode 5, which may be not covered by the second portion 632, for example, the exposed area of the first electrode 5 and the second electrode 8. The blue (B) light and the yellow (Y) light may be shielded by the third color filter 103, and only the red (R) light may be emitted. When the first electrode 5, covered by the second portion 632, cannot contribute to formation of an electric field of the light-emitting layer 7 as described above, only the yellow-green (YG) light of the second stack 73, which may be caused by the leakage current of the charge generation layer 72, may be emitted to the second area 104b. When the second area 104b is a portion of the fourth color filter 104, which may be a blue (B) color filter, and therefore may shield the yellow-green (YG) light, no light can transmit the second area 104b. As such, in the display device 1 according to the fourth embodiment of the present disclosure, it may be possible to avoid occurrence of a color mixture between the third subpixel P3 and the fourth subpixel P4 adjacent to the third subpixel P3 due to the leakage current of the charge generation layer 72 when the third subpixel P3 emits light.

The end of the second portion 632 may not be arranged to be more inward than the end of the second area 104b. For example, the inside (or inward) may mean a direction toward the fourth subpixel P4. If the end of the second portion 632 is arranged to be more inward than the end of the second area 104b, the area of the first electrode 5 covered by the second portion 632 may be reduced. Thus, the exposed area of the first electrode 5 may be relatively increased, and the exposed area of the first electrode 5, which may be increased, and the second area 104b may additionally overlap each other. For example, when the blue (B) light of the first stack 71 is emitted toward the second area 104b when the third subpixel P3 emits light, the blue (B) light can transmit the second area 104b, which may be a blue (B) color filter, and a problem may occur in that a color mixture may be generated. Therefore, in the display device 1 according to the fourth embodiment of the present disclosure, the end of the second portion 632 may be matched with (e.g., coextend with) the end of the second area 104b, or may be arranged outside the end of the second area 104b, and the problem of the color mixture may be solved when the third subpixel P3 emits light. For example, the outside may be a direction toward the first portion 631.

The first area 104a may overlap the fourth subpixel P4. Therefore, when the exposed area of the first electrode 5, which may be not covered by the fourth fence 64, contributes to formation of an electric field when the fourth subpixel P4 emits light, the blue (B) light of the first stack 71 and the yellow-green (YG) light of the second stack 73 may be emitted toward the first area 104a of the fourth color filter 104. For example, when the fourth color filter 104, which may be a blue color filter, transmits only the blue (B) light and shields the yellow-green (YG) light, the fourth subpixel P4 may emit only the blue (B) light.

When the first electrode 5, covered by the fourth fence 64, cannot contribute to formation of an electric field even in the fourth subpixel P4, the yellow-green (YG) light may be emitted from the second stack 73 overlapping the fourth fence 64 due to the leakage current caused by the charge generation layer 72. However, even if the yellow-green (YG) light is emitted from the second stack 73, when the first area 104a is a blue color filter, the first area 104a may shield the yellow-green (YG) light caused by the leakage current. As such, in the display device 1 according to the fourth embodiment of the present disclosure, even if the yellow-green (YG) light is emitted due to the leakage current of the charge generation layer 72 when the fourth subpixel P4 emits light, the first area 104a of the fourth color filter 104, which may be a blue color filter, may shield the yellow-green (YG) light, and therefore may transmit only the blue (B) light without a color mixture.

With further reference to FIG. 14, the display device 1 according to the fourth embodiment of the present disclosure may include a first light-emitting area 7a overlapping the second area 104b. The first light-emitting area 7a may be a portion of the light-emitting layer 7, and, for example, may be a portion overlapping the second area 104b in the second stack 73 of the third subpixel P3. As shown in FIG. 14, when the first light-emitting area 7a overlaps the second portion 632 of the third fence 63, the first light-emitting area 7a may emit the yellow-green (YG) light due to the leakage current of the charge generation layer 72 when the third subpixel P3 emits light. However, as described above, when the light emitted from the first light-emitting area 7a is shielded by the second area 104b of the fourth color filter 104, which may be a blue color filter, the display device 1 according to the fourth embodiment of the present disclosure may reduce or prevent a color mixture from being generated.

In the display device 1 according to the fourth embodiment of the present disclosure, the second area 104b of the fourth color filter 104 may overlap at least a portion of the second portion 632 of the third fence 63. For example, as described above, the end of the second area 104b may be matched with (e.g., coextend with) the end of the second portion 632. The end of the second area 104b may be arranged to be more inward than the end of the second portion 632. For example, the second area 104b may be relatively smaller than shown in FIG. 14. However, for example, the fourth color filter 104 may be larger than the third color filter 103 to reduce or prevent a color mixture from being generated, and the fourth color filter 104 may partially overlap the third subpixel P3. Therefore, the display device 1 according to the fourth embodiment of the present disclosure may reduce or prevent a color mixture from being generated, even if the fourth color filter 104, which may be a blue color filter, is not exactly aligned between the fourth subpixel P4 and the third subpixel P3.

In the fourth embodiment of the present disclosure, a reason why that the trench T may be formed between the fourth subpixel P4 and the third subpixel P3, and the charge generation layer 72 may be disconnected within the trench T, may be to allow the leakage current to not occur between the fourth subpixel P4 and the third subpixel P3 because a problem in picture quality may occur if the leakage current occurs between the fourth subpixel P4 and the third subpixel P3. A reason why that the fourth color filter 104 may be larger than the third color filter 103, and may overlap the third subpixel P3, may be that the yellow-green (YG) light may be shielded by the second area 104b of the fourth color filter 104 to not generate a color mixture, even if the yellow-green (YG) light of the second stack 73 is emitted due to the leakage current of the charge generation layer 72 up to the portion between the fourth subpixel P4 and the third subpixel P3. For example, the charge generation layer 72 may be completely disconnected (e.g., noncontiguous).

In the display device 1 according to the fourth embodiment of the present disclosure, if light is emitted from the third subpixel P3 and light is not emitted from the fourth subpixel P4, as described above, the third color filter 103, overlapping the first electrode 5 exposed from the third fence 63, may transmit the red (R) light, and the second area 104b of the fourth color filter 104, overlapping the third fence 63, may shield the yellow-green (YG) light. For example, the second area 104b of the fourth color filter 104 may serve as a black matrix that may shield leakage of light between the fourth subpixel P4 and the third subpixel P3. Therefore, the display device 1 according to the fourth embodiment of the present disclosure may be provided with a structure having no black matrix.

Although the structure of the display device 1 according to FIGS. 13 and 14, in which the color mixture may be reduced or prevented from being generated, has been described based on the fourth subpixel P4 and the third subpixel P3 of the first pixel PX1 as an example, the structure may be similarly applied to the third subpixel P3 of the first pixel PX1, which may emit red light, and the fourth subpixel P4 of the second pixel PX2, which may emit blue light.

As a result, in the display device 1 according to the fourth embodiment of the present disclosure, the subpixel emitting red light may be surrounded by the subpixel emitting blue light, and the subpixel emitting red light and the subpixel emitting blue light have the structure shown in FIGS. 13 and 14. Thus, a color mixture of the red light and the blue light may be avoided.

Figure 15:
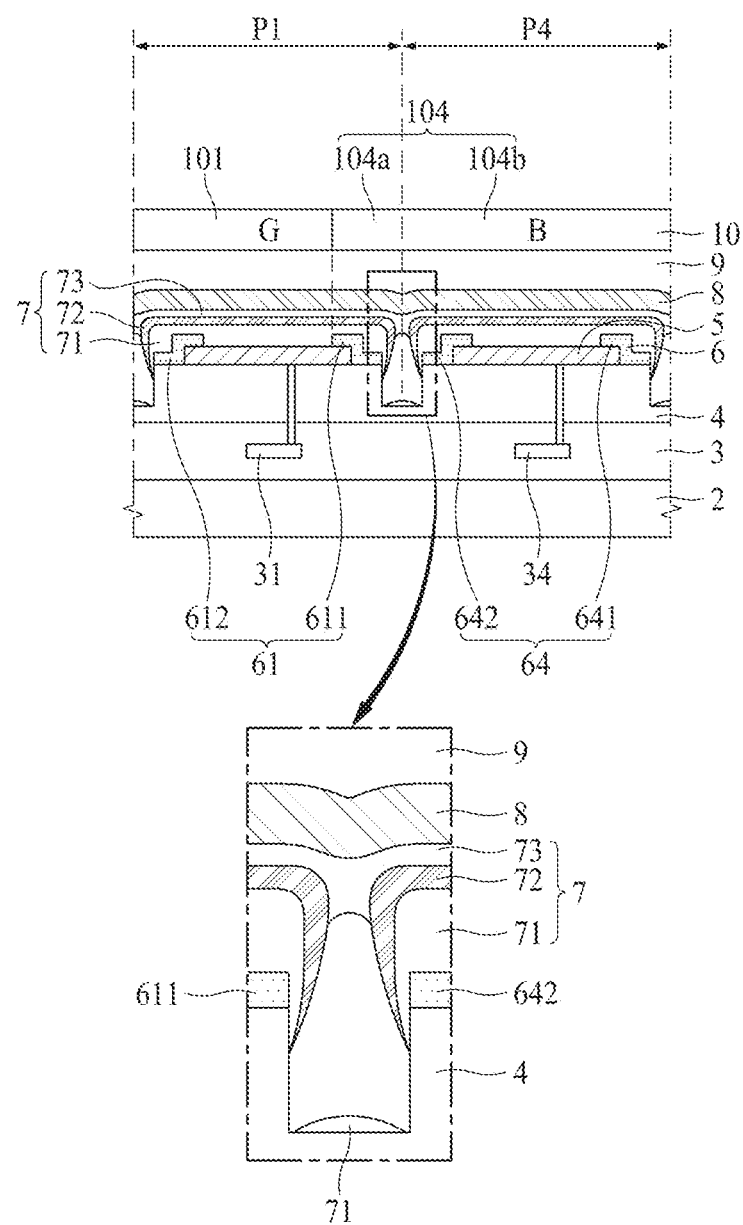
FIG. 15 is a cross-sectional view illustrating one embodiment taken along line IV-IV shown in FIG. 12.
Figure 16:
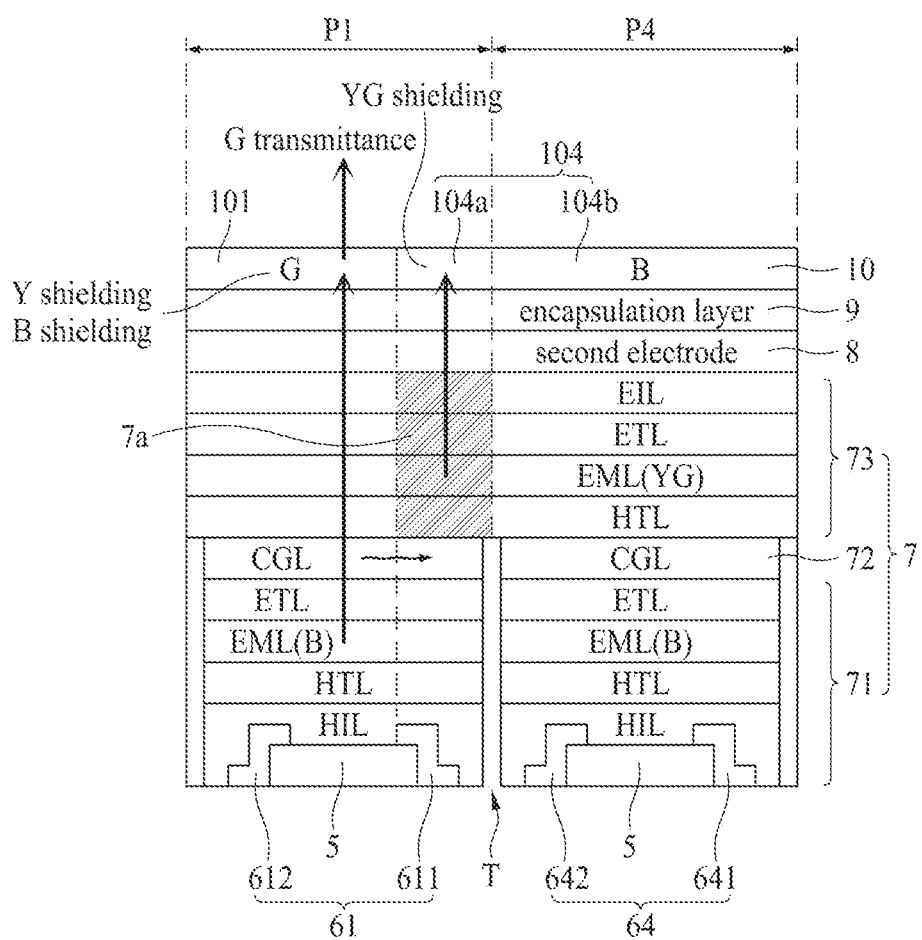
FIG. 16 is a cross-sectional view illustrating a display device including a light-emitting layer of FIG. 15.

FIG. 15 is a cross-sectional view illustrating one embodiment taken alongline IV-IV shown in FIG. 12. FIG. 16 is a cross-sectional view illustrating a display device including a light-emitting layer of FIG. 15.

With reference to FIG. 15, a size of the fourth color filter 104 arranged in the fourth subpixel P4 may be larger than that of the first color filter 101, and may partially overlap the first subpixel P1. The trench T may be provided between the fourth subpixel P4 and the first subpixel P1, and may reduce or prevent a leakage current from occurring between the subpixels P4 and P1 adjacent to each other by disconnecting (e.g., making noncontiguous) a portion of the light-emitting layer of the fourth subpixel P4 and the first subpixel P1. However, for example, when the light-emitting layer is partially formed up to the light-emitting layer and is completely disconnected (e.g., noncontiguous) between the fourth and first subpixels P4 and P1, the leakage current may occur up to the portion in which the light-emitting layer may be formed. Therefore, in the display device 1 according to the fourth embodiment of the present disclosure, when the fourth color filter 104 is arranged to partially overlap the first subpixel P1, it may be possible to avoid occurrence of a color mixture due to a leakage current when the first subpixel P1 emits green light.

With reference to FIG. 16, a first fence 61, surrounding an edge of the first electrode 5, may be provided in the first subpixel P1, and may adjoin the trench T provided between the first subpixel P1 and the fourth subpixel P4. The first fence 61 may include a first portion 611 overlapping one side of the first electrode 5 of the first subpixel P1, and a second portion 612 overlapping the other side of the first electrode 5. As shown in FIG. 16, the first portion 611 of the first fence 61 may overlap a right portion of the first electrode 5, the second portion 612 of the first fence 61 may overlap a left portion of the first electrode 5, and the first portion 611 and the second portion 612 may be spaced apart from each other. A portion in which the first and second portions 611 and 612 may be spaced apart from each other may be the light-emitting area of the first subpixel P1.

Similarly, a fourth fence 64, surrounding an edge of the first electrode 5, may be provided in the fourth subpixel P4, and may adjoin the trench T provided between the fourth subpixel P4 and the first subpixel P1. The fourth fence 64 may include a first portion 641 overlapping one side of the first electrode 5 of the fourth subpixel P4, and a second portion 642 overlapping the other side of the first electrode 5. As shown in FIG. 16, the first portion 641 of the fourth fence 64 may overlap the right portion of the first electrode 5, the second portion 642 of the fourth fence 64 may overlap the left portion of the first electrode 5, and the first portion 641 and the second portion 642 may be spaced apart from each other. A portion in which the first and second portions 641 and 642 are spaced apart from each other may be the light-emitting area of the fourth subpixel P4.

The fourth color filter 104 may include a first area 104a overlapping the first subpixel P1, and a second area 104b overlapping the fourth subpixel P4. The first portion 611 of the first fence 61 may overlap the first area 104a. For example, as shown in FIG. 16, an end of the first portion 611, arranged on the first electrode 5, may be matched with (e.g., coextend with) an end of the first area 104a of the fourth color filter 104 adjacent to the first color filter 101. Although not shown, the end of the first portion 611 may be more protruded toward the first color filter 101. For example, at least a portion of the first portion 611 may overlap the first area 104a of the fourth color filter 104. Therefore, the first electrode 5, covered by the first portion 611, may not contribute to formation of an electric field of the light-emitting layer 7 when the first subpixel P1 emits light, and the charge generation layer 72 may serve as the first electrode 5 due to a leakage current through the charge generation layer 72. Thus, light may be emitted between the charge generation layer 72 and the second electrode 8.

For example, blue (B) light and yellow-green (YG) light may be emitted toward the first color filter 101, which may be a green color filter, by an electric field formed between the first electrode 5, which may be not covered by the first portion 611, for example, the exposed area of the first electrode 5 and the second electrode 8. The blue (B) light and the red (R) light may be shielded by the first color filter 101, and only the green (G) light may be emitted. When the first electrode 5, covered by the first portion 611, cannot contribute to formation of an electric field of the light-emitting layer 7 as described above, only the yellow-green (YG) light of the second stack 73 may be emitted to the first area 104a due to the leakage current of the charge generation layer 72. When the first area 104a is a portion of the fourth color filter 104, which may be a blue (B) color filter, and therefore may shield the yellow-green (YG) light, no light can transmit the first area 104a. As a result, in the display device 1 according to the fourth embodiment of the present disclosure, it may be possible to avoid occurrence of a color mixture between the first subpixel P1 and the fourth subpixel P4 adjacent to the first subpixel P1 due to the leakage current of the charge generation layer 72 when the first subpixel P1 emits light.

The end of the first portion 611 may not be arranged to be more inward than the end of the first area 104a. For example, the inside (e.g., "inward") may mean a direction toward the fourth subpixel P4. If the end of the first portion 611 is arranged to be more inward than the end of the first area 104a, the area of the first electrode 5 covered by the second portion 632 may be reduced. Thus, the exposed area of the first electrode may be relatively increased, and the exposed area of the first electrode 5, which may be increased, and the first area 104a may additionally overlap each other. For example, when the blue (B) light of the first stack 71 is emitted toward the first area 104a when the first subpixel P1 emits light, the blue (B) light can transmit the first area 104a, which may be a blue (B) color filter, and a problem may occur in that a color mixture may be generated. Therefore, in the display device 1 according to the fourth embodiment of the present disclosure, the end of the first portion 611 may be matched with (e.g., coextend with) the end of the first area 104a, or may be arranged outside the end of the first area 104a. Thus, the problem of the color mixture may be solved when the first subpixel P1 emits light. For example, the outside may be a direction toward the second portion 612.

The second area 104b may overlap the fourth subpixel P4. Therefore, when the exposed area of the first electrode 5, which may be not covered by the fourth fence 64, contributes to formation of an electric field when the fourth subpixel P4 emits light, the blue (B) light of the first stack 71 and the yellow-green (YG) light of the second stack 73 may be emitted toward the second area 104b of the fourth color filter 104. For example, when the fourth color filter 104, which may be a blue color filter, transmits only the blue (B) light and shields the yellow-green (YG) light, the fourth subpixel P4 may emit only the blue (B) light.

When the first electrode 5, covered by the fourth fence 64, cannot contribute to formation of an electric field, even in the fourth subpixel P4, the yellow-green (YG) light may be emitted from the second stack 73 overlapping the fourth fence 64 due to the leakage current caused by the charge generation layer 72. However, even though the yellow-green (YG) light may be emitted from the second stack 73, when the first area 104a is a blue color filter, the first area 104a may shield the yellow-green (YG) light caused by the leakage current.

As a result, in the display device 1 according to the fourth embodiment of the present disclosure, even if the yellow-green (YG) light is emitted due to the leakage current of the charge generation layer 72 when the fourth subpixel P4 emits light, the first area 104a of the fourth color filter 104, which may be a blue color filter, may shield the yellow-green (YG) light, and therefore may transmit only the blue (B) light without a color mixture.

With further reference to FIG. 16, the display device 1 according to the fourth embodiment of the present disclosure may include a first light-emitting area 7a overlapping the first area 104a. The first light-emitting area 7a may be a portion of the light-emitting layer 7, and, for example, may be a portion overlapping the first area 104a in the second stack 73 of the first subpixel P1. As shown in FIG. 16, when the first light-emitting area 7a overlaps the first portion 611 of the first fence 61, the first light-emitting area 7a may emit the yellow-green (YG) light due to the leakage current of the charge generation layer 72 when the first subpixel P1 emits light. However, as described above, when the light emitted from the first light-emitting area 7a is shielded by the first area 104a of the fourth color filter 104, which may be a blue color filter, the display device 1 according to the fourth embodiment of the present disclosure may reduce or prevent a color mixture from being generated.

In the display device 1 according to the fourth embodiment of the present disclosure, the first area 104a of the fourth color filter 104 may overlap at least a portion of the first portion 611 of the first fence 61. For example, as described above, the end of the first area 104a may be matched with (e.g., coextend with) the end of the first portion 611. The end of the first area 104a may be arranged to be more inward than the end of the first portion 611. For example, the end of the first area 104a may be relatively smaller than shown in FIG. 16. However, for example, the fourth color filter 104 may be larger than the first color filter 101 to reduce or prevent a color mixture from being generated, and the fourth color filter 104 may partially overlap the first subpixel P1. Therefore, the display device 1 according to the fourth embodiment of the present disclosure may reduce or prevent a color mixture from being generated, even if the fourth color filter 104, which may be a blue color filter, is not exactly aligned between the fourth subpixel P4 and the first subpixel P1.

In the fourth embodiment of the present disclosure, a reason why the trench T may be formed between the fourth subpixel P4 and the first subpixel P1 and the charge generation layer 72 may be disconnected within the trench T may be to not allow the leakage current to occur between the fourth subpixel P4 and the first subpixel P1 because a problem in picture quality may occur if the leakage current occurs between the fourth subpixel P4 and the first subpixel P1. A reason why that the fourth color filter 104 may be larger than the first color filter 101, and may overlap the first subpixel P1, may be that the yellow-green (YG) light may be shielded by the first area 104a of the fourth color filter 104 to not generate a color mixture, even if the yellow-green (YG) light of the second stack 73 is emitted due to the leakage current of the charge generation layer 72 up to the portion between the fourth subpixel P4 and the first subpixel P1. For example, the charge generation layer 72 may be completely disconnected (e.g., noncontinugous).

In the display device 1 according to the fourth embodiment of the present disclosure, if light is emitted from the first subpixel P1 and light is not emitted from the fourth subpixel P4, as described above, the first color filter 101, overlapping the first electrode 5 exposed from the first fence 61, may transmit the green (G) light, and the first area 104a of the fourth color filter 104, overlapping the first fence 61, may shield the yellow-green (YG) light. For example, the first area 104a of the fourth color filter 104 may serve as a black matrix that may shield leakage of light between the fourth subpixel P4 and the first subpixel P1. Therefore, the display device 1 according to the fourth embodiment of the present disclosure may be provided with a structure having no black matrix.

Although the structure of the display device 1 according to the examples of FIGS. 15 and 16, in which the color mixture may be reduced or prevented from being generated, has been described based on the fourth subpixel P4 and the first subpixel P1 of the first pixel PX1 as an example, the structure may be similarly applied to the first subpixel P1 of the third pixel PX3, which may emit green light, and the fourth subpixel P4 of the second pixel PX2, which may emit blue light. As a result, in the display device 1 according to the fourth embodiment of the present disclosure, the subpixel emitting green light may be surrounded by the subpixel emitting blue light, and the subpixel emitting green light and the subpixel emitting blue light have the structure shown in FIGS. 15 and 16, and a color mixture of the green light and the blue light may be avoided.

In the display device 1 according to the fourth embodiment of the present disclosure, the fourth subpixel P4 may be driven separately or simultaneously with the second subpixel P2. For example, if the fourth subpixel P4 and the second subpixel P2 are driven simultaneously, the fourth subpixel P4 and the second subpixel P2 may share a driving circuit, and a fourth sub-electrode of the fourth subpixel P4 and a second sub-electrode of the second subpixel P2 may be separated from each other. The second sub-electrode and the fourth sub-electrode may be the first electrode 5 of the present disclosure, e.g., an anode.

Also, in the display device 1 according to the fourth embodiment of the present disclosure, four subpixels, for example, the first to fourth subpixels P1, P2, P3, and P4, may constitute one pixel, for example, PX1, as one unit. As another example, red (R), green (G), and blue (B) subpixels may constitute one unit, but the fourth subpixel P4 may be a subpixel that belongs to another pixel.

In the display device according to an embodiment of the present disclosure, when the trench is provided between adjacent subpixels and the second color filter provided in the second subpixel is larger than the first color filter provided in the first subpixel, a color mixture of light of the second subpixel may be avoided when the first subpixel emits light.

Figure 17A:
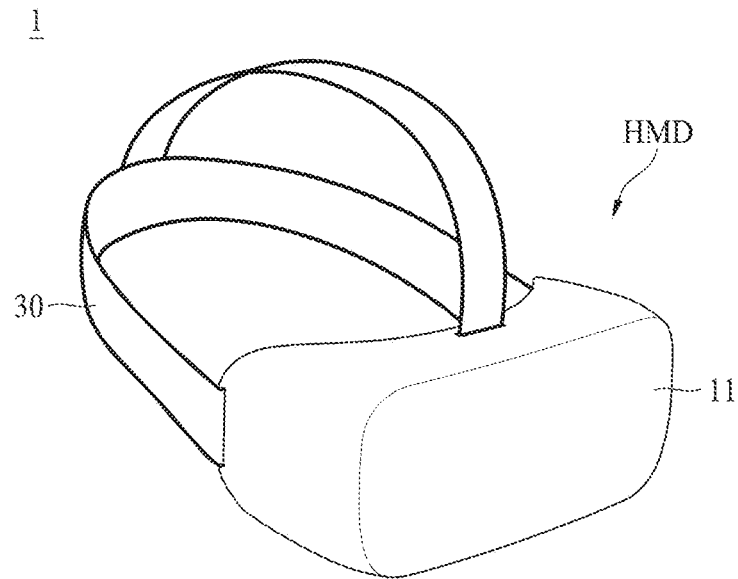
FIGS. 17A to 17C are views illustrating a display device according to a fifth embodiment of the present disclosure, and relate to a head-mounted display (HMD) device.
Figure 17B:
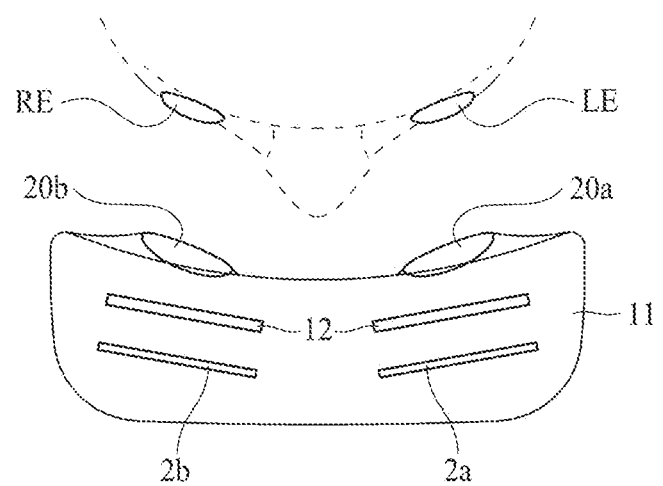
Figure 17C:
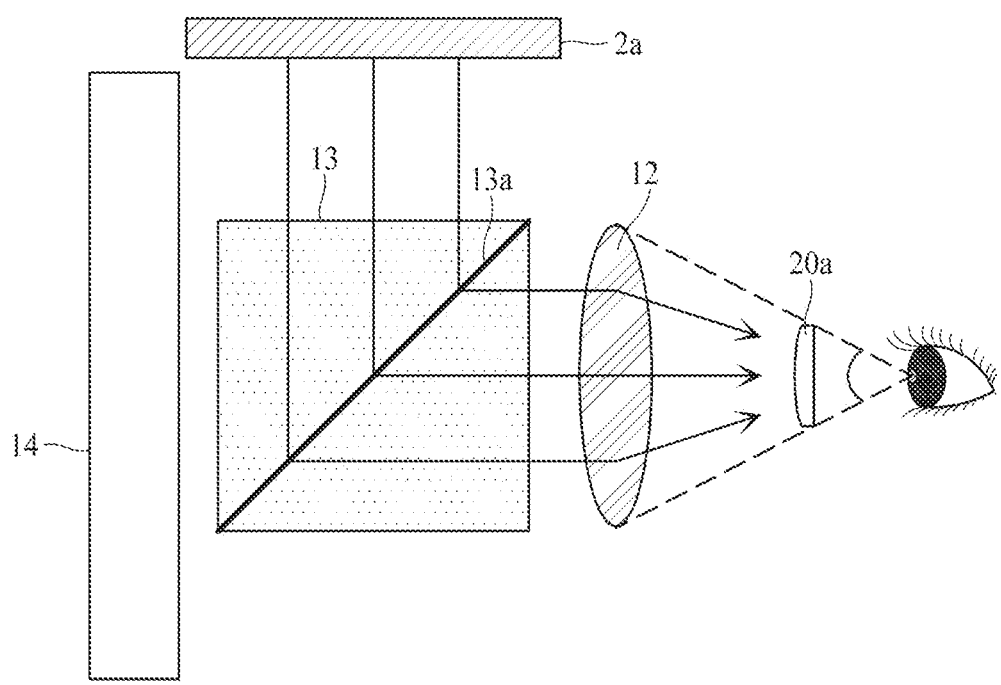

FIGS. 17A to 17C are views illustrating a display device according to a fifth embodiment of the present disclosure, and relate to a head-mounted display (HMD) device.

FIG. 17A is a perspective view. FIG. 17B is a plan view of a virtual reality (VR) structure. FIG. 17C is a cross-sectional view of an augmented reality (AR) structure.

As shown in FIG. 17A, a head mounted display device according to the present disclosure may include a storage case 11 and a head-mounted band 30. The storage case 11 may store the display device, including a substrate (e.g., substrate 2 of FIG. 1), a lens array, and an ocular lens therein.

The head mounted band 30 may be fixed to the storage case 11. The head mounted band 30 may surround a top surface and both sides of a user's head, but is not limited to this example. The head mounted band 30 may fix a head mounted display to a user's head, and may be replaced with a structure having a shape of a glasses frame or a helmet shape.

As shown in FIG. 17B, a head mounted display device of a virtual reality (VR) structure according to an embodiment of the present disclosure may include a left eye display device 2a, a right eye display device 2b, a lens array 12, a left eye ocular lens 20a, and a right eye ocular lens 20b. The left eye display device 2a, the right eye display device 2b, the lens array 12, the left eye ocular lens 20a, and the right eye ocular lens 20b may be stored in the aforementioned storage case 11.

The left eye display device 2a and the right eye display device 2b may display the same image, and, for example, a user may view 2D image. Alternatively, the left eye display device 2a may display a left eye image, and the right eye display device 2b may display a right eye image, and, for example, a user may view a 3D image. Each of the left eye display device 2a and the right eye display device 2b may include a display device according to any of FIGS. 1 to 16 described above. For example, each of the left eye display device 2a and the right eye display device 2b may be an organic light-emitting display device. Each of the left eye display device 2a and the right eye display device 2b may include a plurality of subpixels, an insulating layer 4, a first electrode 5, a fence 6, a light-emitting layer 7, a second electrode 8, an encapsulation layer 9, and a color filter layer 10, and may display various images by combining colors of light emitted from each of the subpixels in various manners.

The lens array 12 may be provided between the left eye ocular lens 20a and the left eye display device 2a by being spaced apart from each of the left eye ocular lens 20a and the left eye display device 2a. For example, the lens array 12 may be arranged in front of the left eye ocular lens 20a and behind the left eye display device 2a. Also, the lens array 12 may be provided between the right eye ocular lens 20b and the right eye display device 2b by being spaced apart from each of the right eye ocular lens 20b and the right eye display device 2b. For example, the lens array 12 may be arranged in front of the right eye ocular lens 20b and behind the right eye display device 2b.

The lens array 12 may be a micro lens array. The lens array 12 may be replaced with a pin hole array. Due to the lens array 12, images displayed on the left eye display device 2a or the right eye display device 2b may be viewed to be magnified to a user. A left eye LE of a user may be arranged in the left eye ocular lens 20a, and a right eye RE of a user may be arranged in the right eye ocular lens 20b.

As shown in FIG. 17C, a head mounted display device of an AR structure according to an embodiment of the present disclosure may include a left eye display device 2a, a lens array 12, a left eye ocular lens 20a, a transmissive reflection portion 13, and a transmissive window 14. Although only a structure for a left eye is shown in FIG. 17C for convenience, a structure for a right eye may be substantially similar to the structure for the left eye. The left eye display device 2a, the lens array 12, the left eye ocular lens 20a, the transmissive reflection portion 13, and the transmissive window 14 may be stored in the aforementioned storage case 11.

The left eye display device 2a may be arranged at one side of the transmissive reflection portion 13, for example, at an upper side, without covering the transmissive window 14. Therefore, the left eye display device 2a may provide the transmissive reflection portion 13 with an image without covering an outer background viewed through the transmissive window 14. The left eye display device 2a may include a display device according to any of FIGS. 1 to 16 described above. For example, the top portion corresponding to the surface where images may be displayed in any of FIGS. 1 to 16, for example, an encapsulation layer 9 or a color filter layer 10, may face the transmissive reflection portion 13.

The lens array 12 may be provided between the left eye ocular lens 20a and the transmissive reflection portion 13. A left eye of a user may be arranged in the left eye ocular lens 20a.

The transmissive reflection portion 13 may be arranged between the lens array 12 and the transmissive window 14. The transmissive reflection portion 13 may include a reflective surface 13a, which may transmit a portion of light, and may reflect another portion of light. The reflective surface 13a may be formed to make an image displayed on the left eye display device 2a to proceed toward the lens array 12. Therefore, a user may view all of images displayed on the left eye display device 2a and an outer background through the transmissive window 14. For example, when the user views one image by overlapping background in reality with virtual images, augmented reality (AR) may be embodied. The transmissive window 14 may be arranged in front of the transmissive reflection portion 13.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display device, comprising: a substrate comprising: a first subpixel; a second subpixel; and a third subpixel; an insulating layer comprising a trench on the substrate between at least two among the first subpixel, the second subpixel, and the third subpixel; a first electrode on the insulating layer in each of the first subpixel, the second subpixel, and the third subpixel; a fence in each of the first subpixel, the second subpixel, and the third subpixel, the fence surrounding an edge of the first electrode; a light-emitting layer on the first electrode, the fence, and the insulating layer; a second electrode on the light-emitting layer; and a color filter layer comprising: a first color filter in the first subpixel; a second color filter in the second subpixel; and a third color filter in the third subpixel, wherein the second color filter is wider than the first color filter, wherein the second color filter partially overlaps the first subpixel, wherein the trench partially disconnects the light-emitting layer, and wherein the second color filter does not overlap the first color filter in a thickness direction of the substrate.

2. The display device of claim 1, wherein:
the second color filter is wider than the third color filter; and
the second color filter partially overlaps the third subpixel.

3. The display device of claim 1, wherein:
the fence comprises:
   a first fence in the first subpixel;
   a second fence in the second subpixel; and
   a third fence in the third subpixel; and
each of the first fence, the second fence, and the third fence adjoins the trench.

4. The display device of claim 3, wherein:
each of the first fence, the second fence, and the third fence comprises:
   a first portion overlapping one side of the first electrode; and
   a second portion overlapping the other side of the first electrode; and
the first portion and the second portion are spaced apart from each other.

5. The display device of claim 4, wherein:
at least a portion of the first portion of the first fence overlaps the second color filter;
at least a portion of the second portion of the third fence overlaps the second color filter;
the first portion of the first fence is closer to the second subpixel than the second portion of the first fence; and
the second portion of the third fence is closer to the second subpixel than the first portion of the third fence.

6. The display device of claim 4, wherein the second color filter comprises:
   a first area overlapping the first subpixel comprising the first portion of the first fence;
   a third area overlapping the third subpixel comprising the second portion of the third fence; and
   a second area overlapping the second subpixel between the first area and the third area.

7. The display device of claim 6, wherein:
the light-emitting layer comprises a first light-emitting area overlapping the first area; and
light emitted from the first light-emitting area is shielded by the first area of the second color filter.

8. The display device of claim 6, wherein:
the light-emitting layer comprises a second light-emitting area overlapping the third area; and
light emitted from the second light-emitting area is shielded by the third area of the second color filter.

9. The display device of claim 6, wherein the first area of the second color filter overlaps at least a portion of the first portion of the first fence.

10. The display device of claim 6, wherein the third area of the second color filter overlaps at least a portion of the second portion of the third fence.

11. The display device of claim 6, wherein:
the first area of the second color filter has a first length;
the third area of the second color filter has a second length; and
the first length and the second length are equal to each other.

12. The display device of claim 6, wherein:
the first area of the second color filter has a first length;
the third area of the second color filter has a second length; and
the first length and the second length are different from each other.

13. The display device of claim 1, wherein:
the light-emitting layer comprises:
   a first stack configured to emit light of a first color;
   a second stack configured to emit light of a second color different from the first color; and
   a charge generation layer between the first stack and the second stack; and
the first stack and the charge generation layer are each noncontiguous inside the trench.

14. The display device of claim 1, wherein:
the fence comprises:
   a first fence in the first subpixel;
   a second fence in the second subpixel; and
   a third fence in the third subpixel; and
each of the first fence, the second fence, and the third fence does not adjoin the trench.

15. The display device of claim 1, wherein:
the substrate further comprises a fourth subpixel;
the first subpixel is configured to emit green light;
the second subpixel is configured to emit blue light;
the third subpixel is configured to emit red light;
the fourth subpixel is configured to emit blue light; and
the first subpixel is surrounded by the second subpixel and the fourth subpixel.

16. The display device of claim 15, wherein:
the color filter layer comprises a fourth color filter in the fourth subpixel;
the fourth color filter is wider than the third color filter; and
the fourth color filter partially overlaps the third subpixel.

17. The display device of claim 16, wherein:
the fourth color filter is wider than the first color filter; and
the fourth color filter partially overlaps the first subpixel.

18. The display device of claim 15, wherein:
the trench is between the first subpixel and the fourth subpixel;
the trench is between the third subpixel and the fourth subpixel;
the fence further comprises a fourth fence in the fourth subpixel; and
the fourth fence adjoins the trench.

* * * * *